(12) United States Patent
Cho et al.

(10) Patent No.: US 8,497,174 B2
(45) Date of Patent: Jul. 30, 2013

(54) METHOD OF FABRICATING SEMICONDUCTOR DEVICE INCLUDING VERTICAL CHANNEL TRANSISTOR

(75) Inventors: Young-seung Cho, Yongin-si (KR); Dae-ik Kim, Yongin-si (KR); Yoo-sang Hwang, Suwon-si (KR); Hyun-woo Chung, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 46 days.

(21) Appl. No.: 13/240,135

(22) Filed: Sep. 22, 2011

(65) Prior Publication Data
US 2012/0094454 A1    Apr. 19, 2012

(30) Foreign Application Priority Data
Oct. 15, 2010  (KR) .................. 10-2010-0101039

(51) Int. Cl.
*H01L 21/336* (2006.01)
*H01L 21/76* (2006.01)
*H01L 21/4763* (2006.01)

(52) U.S. Cl.
USPC ...................... 438/270; 438/427; 438/589

(58) Field of Classification Search
USPC .......................... 438/270, 427, 589
See application file for complete search history.

(56) References Cited

U.S. PATENT DOCUMENTS 7,109,544 B2 * 9/2006 Schloesser et al. ........... 257/302
7,601,608 B2   10/2009 Wells
8,207,032 B2 * 6/2012 Fischer et al. ................ 438/242

FOREIGN PATENT DOCUMENTS

KR         100739532    7/2007
KR      1020080113854   12/2008

* cited by examiner

Primary Examiner — Luan C Thai
(74) Attorney, Agent, or Firm — F. Chau & Associates, LLC

(57) ABSTRACT

A method of fabricating a semiconductor device including a vertical channel transistor. The method may include: forming a plurality of first device isolation layers in a substrate as a pattern of lines having a first depth from an upper surface of a substrate, to define a plurality of active regions, forming a plurality of trenches having a second depth smaller than the first depth, etching portions of the substrate that are under some of the plurality of trenches that are selected at a predetermined interval, to form a plurality of device isolation trenches having a third depth that is greater than the second depth, forming second device isolation layers that include an insulating material, in lower portions of the plurality of device isolation trenches, and forming buried bit lines in lower portions of the plurality of trenches and the plurality of device isolation trenches.

20 Claims, 24 Drawing Sheets

METHOD OF FABRICATING SEMICONDUCTOR DEVICE INCLUDING VERTICAL CHANNEL TRANSISTOR

CROSS-REFERENCE TO RELATED APPLICATIONS

This application claims priority to Korean Patent Application No. 10-2010-0101039, filed on Oct. 15, 2010, the disclosure of which is hereby incorporated by reference herein in its entirety.

BACKGROUND (i) Technical Field

Exemplary embodiments of the inventive concept relate to methods of fabricating semiconductor memory devices, and more particularly, to a method of fabricating a semiconductor device including a vertical channel transistor.

(ii) Description of the Related Art

With the increasing integration of semiconductor devices, the design rule for components in the semiconductor devices is decreasing. In a semiconductor device having a plurality of transistors, a gate length has been reduced. The gate length is a reference of the design rule. Accordingly, a channel length in each transistor has also been reduced. A vertical channel transistor may increase a distance between a source region and a drain region, and may increase an effective channel length in a transistor of a highly integrated semiconductor device.

SUMMARY

Exemplary embodiments of the inventive concept provide a method of fabricating a semiconductor device of a micro unit cell size having a vertical channel transistor structure. In the semiconductor device, contact gates may have a constant channel width.

Exemplary embodiments of the inventive concept also provide a method of fabricating a semiconductor device by which bit lines may be effectively insulated from neighboring active regions.

According to an exemplary embodiment of the inventive concept, there is provided a method of fabricating a semiconductor device, the method including: forming a plurality of first device isolation layers in a substrate as a pattern of lines, the plurality of first device isolation layers extending in a first direction and having a first depth from an upper surface of a substrate, to define a plurality of active regions that extend in the first direction as a pattern of lines, forming a plurality of trenches that extend in a second direction perpendicular to the first direction and that have a second depth smaller than the first depth, and a first width, etching portions of the substrate that are under some of the plurality of trenches that are selected at a predetermined interval, to form a plurality of device isolation trenches having a third depth that is greater than the second depth, forming second device isolation layers that include an insulating material, in lower portions of the plurality of device isolation trenches and forming buried bit lines in lower portions of the plurality of trenches and the plurality of device isolation trenches.

In an embodiment, in the forming of the second device isolation layers, portions of the substrate that are exposed by the bottom and sidewall of the plurality of device isolation trenches may be oxidized to form the second device isolation layers.

In an embodiment, the method may further include, after the forming of the plurality of trenches, forming an insulating liner in the plurality of trenches.

In an embodiment, the forming of the plurality of device isolation trenches may include: forming a mask pattern including openings that expose some of the plurality of trenches where the device isolation trenches are to be formed, removing the insulating liner from bottoms of the trenches that are exposed by the openings and etching portions of the substrate that are exposed by the removing of the insulating liners from the bottoms of the trenches.

In an embodiment, in the forming of the second device isolation layers, portions of the substrate that are in the lower portions of the plurality of device isolation trenches may be selectively oxidized using the insulating liners on the sidewalls of the device isolation trenches as anti-oxidation layers, according to a local oxidation of silicon (LOCOS) process.

In an embodiment, In the forming of the plurality of device isolation trenches, the plurality of device isolation trenches may be formed in alternating ones of intersections at which the plurality of trenches cross the first active regions.

In an embodiment, the second device isolation layers may have a second width that is greater than the first width.

In an embodiment, the method may further include, after the forming of the second device isolation layers, partially etching portions of the substrate and the first device isolation layers that are below the plurality of trenches, and portions of the second device isolation layers that are below the plurality of device isolation trenches.

In an embodiment, after the partial etching, the plurality of trenches and the plurality of device isolation trenches may have a depth that is less than the first depth.

In an embodiment, the method may further include, after the partial etching, implanting dopant ions at a low concentration to define first source/drain regions in the substrate.

In an embodiment, the partial etching may be performed in two stages, one of etching to a predetermined depth, and the other of further etching to a desired depth, and the partial etching may further include, between the two stages, performing an ion implantation process for forming the first source/drain regions in the substrate.

In an embodiment, the method may further include, after the forming of the plurality of trenches, forming an oxide layer on the sidewalls of the plurality of trenches.

In an embodiment, the method may further include, after the forming of the second device isolation layers, performing an ion implantation process of forming the first source/drain regions in the substrate.

In an embodiment, in the ion implantation process, impurity ions may be implanted in portions of the active regions that are adjacent to the lower surfaces and sidewalls of the buried bit lines formed in the plurality of trenches.

In an embodiment, the lower surfaces of the buried bit lines may be located at a depth that is less than the second depth.

In an embodiment, upper surfaces of the buried bit lines may be located at a level lower than the upper surface of the substrate.

In an embodiment, the active regions may each include two active pillars between each two adjacent device isolation trenches, the two active pillars being separated by one of the plurality of trenches.

In an embodiment, the method may further include: forming an insulating layer on the buried bit lines to fill the plurality of trenches and the plurality of device isolation trenches, forming second source/drain regions in upper portions of the plurality of active regions, forming a gate insulating layer on one vertical surface of each of the active pillars, and forming a contact gate that has a lower surface lower than the upper surface of the substrate and that faces the one vertical surface with the gate insulating layer therebetween, and forming word lines that extend on the upper surface of the substrate and are connected to the contact gates.

According to an exemplary embodiment of the inventive concept, there is provided a method of fabricating a semiconductor device, the method including: defining a plurality of active regions in a substrate as a pattern of lines, forming a plurality of trenches that extend perpendicular to the plurality of active regions, etching portions of the substrate that are under some of the plurality of trenches that are selected at a predetermined interval, to form a plurality of device isolation trenches, forming an insulating layer in lower portions of the plurality of device isolation trenches and forming buried bit lines in lower portions of the plurality of trenches and the plurality of device isolation trenches.

According to an exemplary embodiment of the inventive concept, there is provided a method of fabricating a semiconductor device, the method including: defining a plurality of first active regions in a substrate as a pattern of lines, forming a plurality of trenches that extend perpendicular to the plurality of first active regions in the substrate, extending some of the plurality of trenches to a depth to form a plurality of device isolation trenches and forming an insulating layer in the plurality of device isolation trenches to form a plurality of second active regions having an island shape.

According to an exemplary embodiment of the inventive concept, A method of fabricating a semiconductor device is provided. The method includes forming a plurality of first device isolation layers in a substrate as a pattern of lines, and the plurality of first device isolation layers extending parallel to each other in a first direction and having a first depth from an upper surface of a substrate, to define a plurality of first active regions as a pattern of lines extending parallel to each other, sequentially forming a pad oxide layer pattern and a first mask pattern on the first device isolation layers and the first active regions as a pattern of lines extending parallel to each other in a second direction, etching portions of the first device isolation layers and the first active regions that are exposed by the pad oxide layer pattern and the first mask pattern to form a plurality of bit line trenches in the first device isolation layers and the first active regions at a second depth smaller than the first depth of the first device isolation layer. The bit lines divide the first active regions into a plurality of active pillars.

The method further includes forming an insulating liner on an upper surface of the first mask pattern and on inner walls of each of the bit line trenches, forming a second mask pattern including a plurality of openings alternatively arranged and which expose bottoms of some of the plurality of bit line trenches, etching portions of the insulating liner on the upper surface of first mask pattern and on the bottoms of the bit line trenches exposed by the openings of the second mask pattern to extend the exposed bit line trenches thereby forming a plurality of device isolation trenches having a third depth greater than the second depth such that the first active regions as a pattern of lines are divided by the device isolation trenches into second active regions having an island shape, removing the second mask pattern, oxidizing portions of the second active regions of the substrate to form a plurality of second device isolation layers in a lower portion of each of the device isolation trenches and reducing the third depth of the device isolation trenches, removing the insulating liners on a bottom of the bit line trenches not exposed by the second mask pattern, and performing an ion implantation process using the first mask pattern as an ion implantation mask to define heavily-doped dopant regions in portions of the second active regions that are exposed by a bottom and a sidewall of the device isolation trenches as first source/drain regions.

In addition, the method further includes forming a plurality of bit lines in lower portions of the bit line trenches and the device isolation trenches, such that each of the bit lines extends between an adjacent two of the plurality of active pillars in one of the plurality of second active regions, removing the second mask pattern and the pad oxide layer pattern and forming an insulating layer in the bit line trenches and the device isolation trenches above the bit lines, such that the insulating layer covers a corresponding one of the bit lines between the adjacent two of each of the plurality of active pillars of a corresponding one of the second active regions and the insulating layer extends above and parallel to the bit lines across the plurality of active regions through inner spaces in the bit line trenches and the device isolation trenches and performing an ion implantation process on an upper surface of the active pillars to form second source/drain regions.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Exemplary embodiments of present invention will now be described more fully with reference to the accompanying drawings, in which exemplary embodiments of the invention are shown. This invention may, however, be embodied in many different forms and should not be construed as limited to exemplary embodiments set forth herein.

Figure 1:
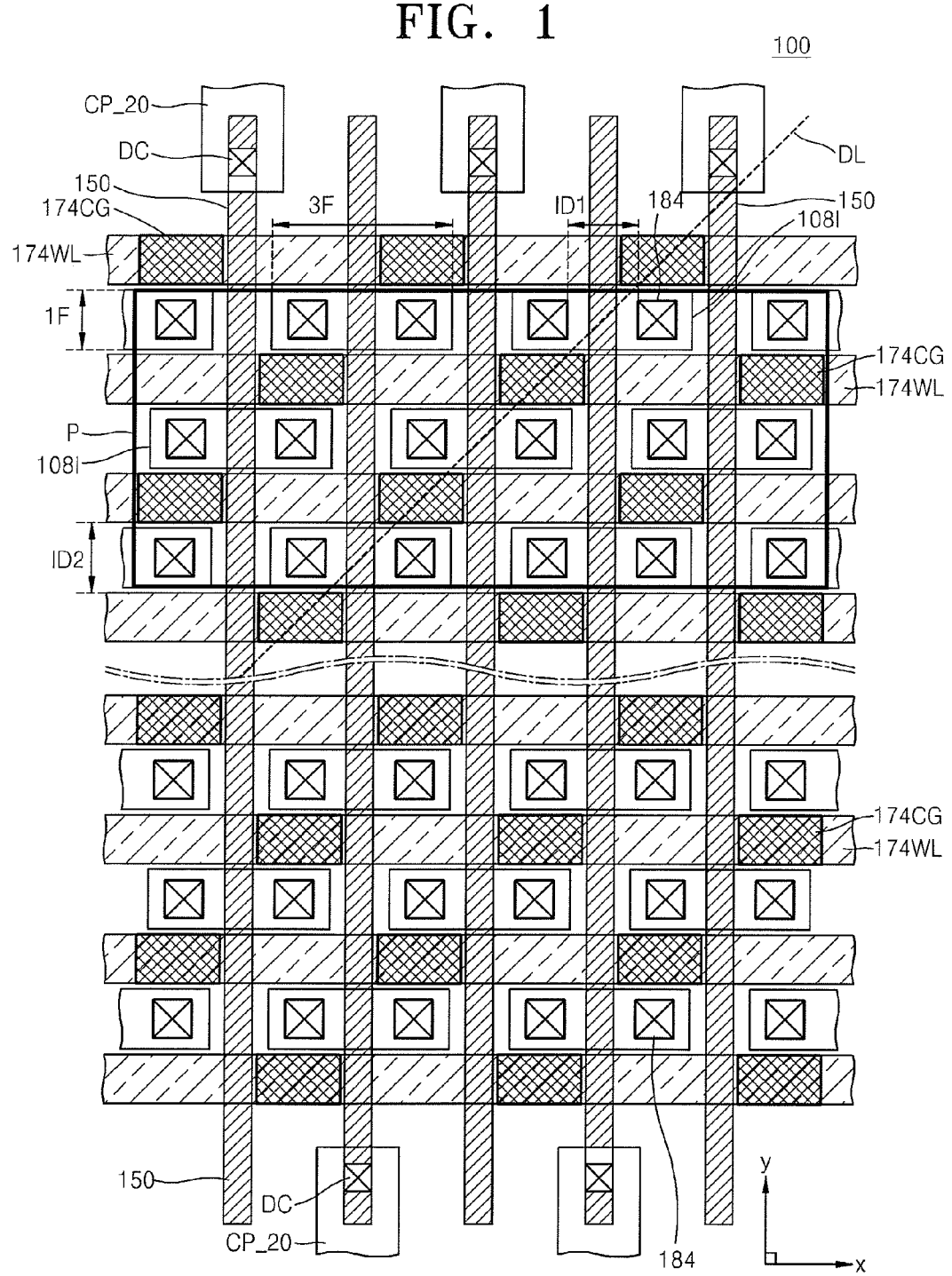
FIG. 1 is a schematic layout of a semiconductor device according to an exemplary embodiment of the inventive concept.

FIG. 1 is a schematic layout of a semiconductor device 100, according to an exemplary embodiment of the inventive concept.

Figure 2A:
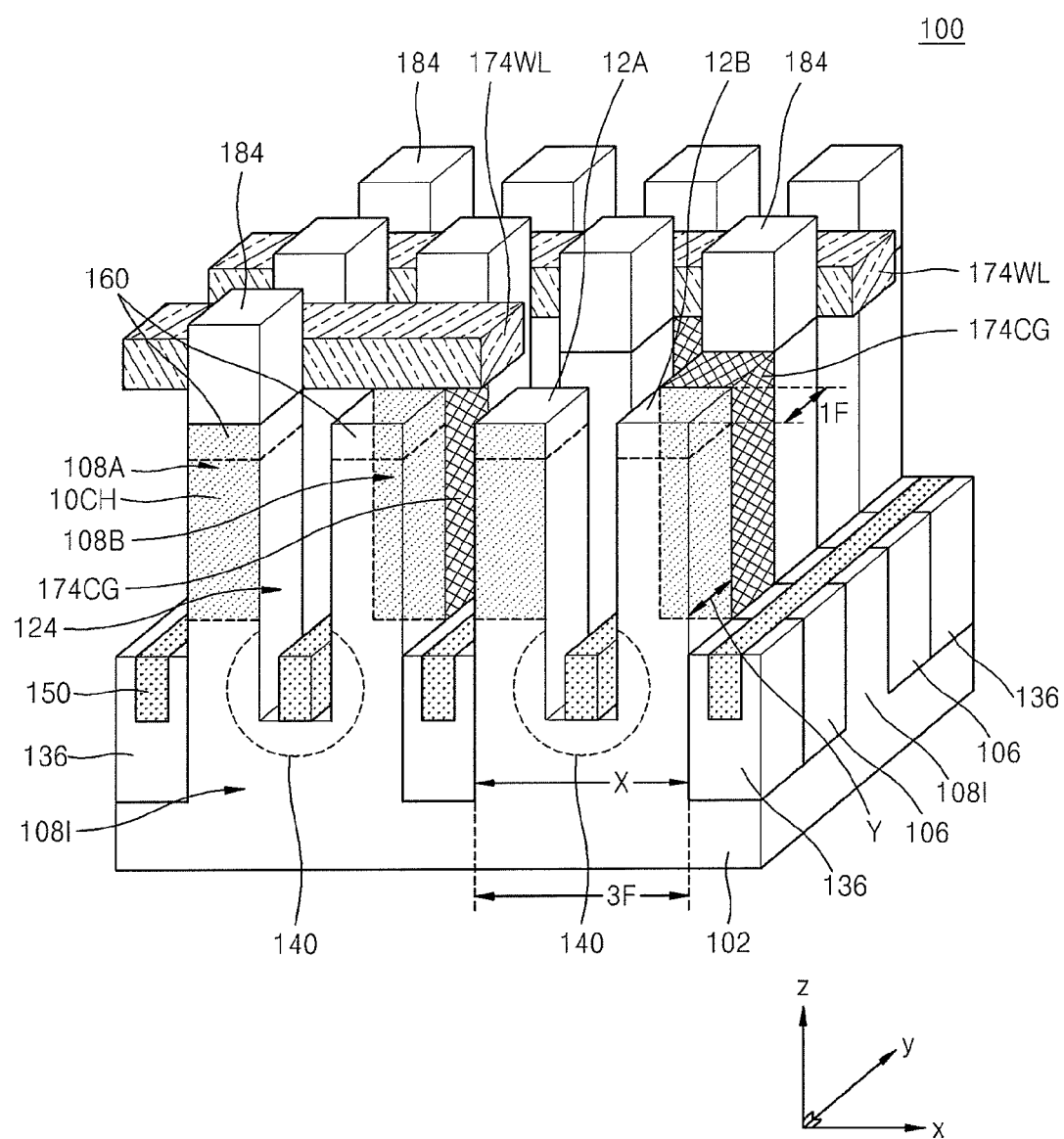
FIG. 2A is a partial perspective view of a three-dimensional (3D) arrangement of components constituting the semiconductor device of FIG. 1, according to an exemplary embodiment of the inventive concept.

FIG. 2A is a partial perspective view of a three-dimensional (3D) arrangement of components constituting the semiconductor device 100 of FIG. 1, according to an exemplary embodiment of the inventive concept.

The layout of FIG. 1 may be applied to, for example, a dynamic random access memory (DRAM), in particular, a DRAM memory cell having a unit cell size of $4F^2$. In this regard, 1F indicates a minimum feature size.

Referring to FIGS. 1 and 2A, the semiconductor device 100 includes, for example, a plurality of active regions 108I (corresponding the second active regions 108I in FIG. 7B) that may be defined as islands on a substrate 102 by first device isolation layers 106 and second device isolation layers 136. The plurality of active regions 108I may be each divided into two active pillars 108A and 108B in an upper portion of the substrate 102 by a trench 124 (corresponding to the bit line trenches in FIGS. 4B-13B). The trench 124 is recessed from an upper center region of each of the active regions 108I to a predetermined depth. A first source/drain region 140 is defined in a region of each active region 108I where the two active pillars 108A and 108B diverge. The two active pillars 108A and 108B have separate upper surfaces 12A and 12B, respectively. The upper surfaces 12A and 12B of the active pillars 108A and 108B may correspond to an upper surface of the substrate 102. Second source/drain regions 160 may be respectively formed on the upper surfaces 12A and 12B of the two active pillars 108A and 108B.

The plurality of active regions 108I may have, for example, a length of 3F in a first direction, which is a longer axis (X) direction (e.g, the x-direction in FIGS. 1 and 2A), and a length of 1F in a second direction, which is a shorter axis (Y) direction (e.g., the y-direction in FIGS. 1 and 2A).

A plurality of buried bit lines 150 extend parallel to each other in the shorter axis (Y) direction of the active regions 108I in the substrate 102. Each of the buried bit lines 150 may be located on a bottom of the trench 124 by which one active region 108I is divided into the two active pillars 108A and 108B. The plurality of buried bit lines 150 may extend in the shorter axis (Y) direction of the active regions 108I to cross over the active regions 108I, the first device isolation layer 106, and the second device isolation layer 136.

The two active pillars 108A and 108B of each active region 108I may each have a vertical surface 10CH that functions as a surface of a vertical channel. The vertical surfaces 10CH may face contact gates 174CG. The vertical surfaces 10CH of the two active pillars 108A and 108B in one active region 108I may face toward the contact gates 174CG in opposite directions with each other. On the vertical (channel) surface 10CH may be formed a vertical channel that extends between the first source/drain region 140, which may be formed around each of the buried bit lines 150, and the second source/drain region 160, which may be formed on each of the upper surfaces 12A and 12B of the active pillars 108A and 108B.

The two active pillars 108A and 108B constituting one active region 108I may respectively form separate unit memory cells. The two unit memory cells respectively including the two active pillars 108A and 108B of one active region 108I may share one first source/drain region 140 formed around the buried bit line 150.

Lower surfaces of the contact gates 174CG may be located, for example, at a higher level than the upper surfaces of the buried bit lines 150 on the substrate 102. In an embodiment, a distance from the upper surfaces 12A and 12B of the active pillars 108A and 108B, which correspond to the upper surface of the substrate 102, to the bottom surfaces of the contact gates 174CG may be, for example, smaller than a distance from the upper surfaces 12A and 12B of the active pillars 108A and 108B to the upper surfaces of the buried bit lines 150.

A plurality of word lines 174WL may extend parallel to each other in a direction (e.g., the x-direction in FIGS. 1 and 2A) perpendicular to the direction in which the plurality of buried bit lines 150 extend. The plurality of word lines 174WL may be electrically connected to the plurality of contact gates 174CG that are arranged in a line along the extension direction of each of the word lines 174WL. In an embodiment, the plurality of word lines 174WL may be, for example, integrally formed with the plurality of contact gates 174CG that are arranged in the direction in which the word lines 174WL extend. In an embodiment, the plurality of word lines 174WL, and the plurality of contact gates 174CG, which are arranged in a line along the extension direction of each of the word lines 174WL, may be formed, for example, in different layers by separate deposition processes. The different layers may, for example, directly contact with each other.

As illustrated in FIG. 1, one contact gate 174CG may be located between each two neighboring active regions 108I disposed in a direction between the x- and y-directions, for example, in a diagonal line (DL) direction. A unit memory cell including one active pillar 108A of one of the two active regions 108I adjacent each other in the y-direction and a unit memory cell including one active pillar 108B of the other adjacent active region 108I may share one contact gate 174CG disposed therebetween.

Buried contact plugs 184 may be respectively formed on the second source/drain regions 160 disposed on the upper surfaces of the active pillars 108A and 108B. In an embodiment, as illustrated in FIG. 2A, the buried contact plugs 184 may, for example, directly contact the second source/drain regions 160, respectively. Although not illustrated, a lower electrode of a capacitor may be disposed on each of the buried contact plugs 184.

In forming a memory cell array having a unit memory cell size of $4F^2$ as illustrated in FIGS. 1 and 2A, when the plurality of buried bit lines 150 are disposed in the substrate 102, vertical channel regions may not be disturbed by a bias even when a high bias voltage is applied to the buried bit lines 150 of the semiconductor device 100 including a vertical channel transistor structure. An insulating distance (ID1) may be provided between two neighboring buried contact plugs 184 in the direction in which the word lines 174WL extend (e.g, the x-direction in FIGS. 1 and 2A). An insulating distance (ID2) may be provided between two neighboring word lines 174WL in the direction in which the buried bit lines 150 extend (e.g, the y-direction in FIGS. 1 and 2A).

In the semiconductor device 100 illustrated in FIGS. 1 and 2A, the plurality of buried bit lines 150 in one cell array region may be electrically connected, at one of the ends thereof, to core/peri bit lines CP_20 in a core region or peripheral circuit region (hereinafter, "core/peri region"). In an embodiment, the core/peri bit lines CP_20 may be disposed on an upper portion of the substrate 102. Accordingly, to electrically connect the buried bit lines 150 to the core/peri bit lines CP_20, direct contact (DC) plugs that extend in a vertical direction (e.g., the z-direction in FIG. 2A) between the core/peri bit lines CP_20 and the buried bit lines 150 may be formed in an edge region of the cell array region.

Figure 2B:
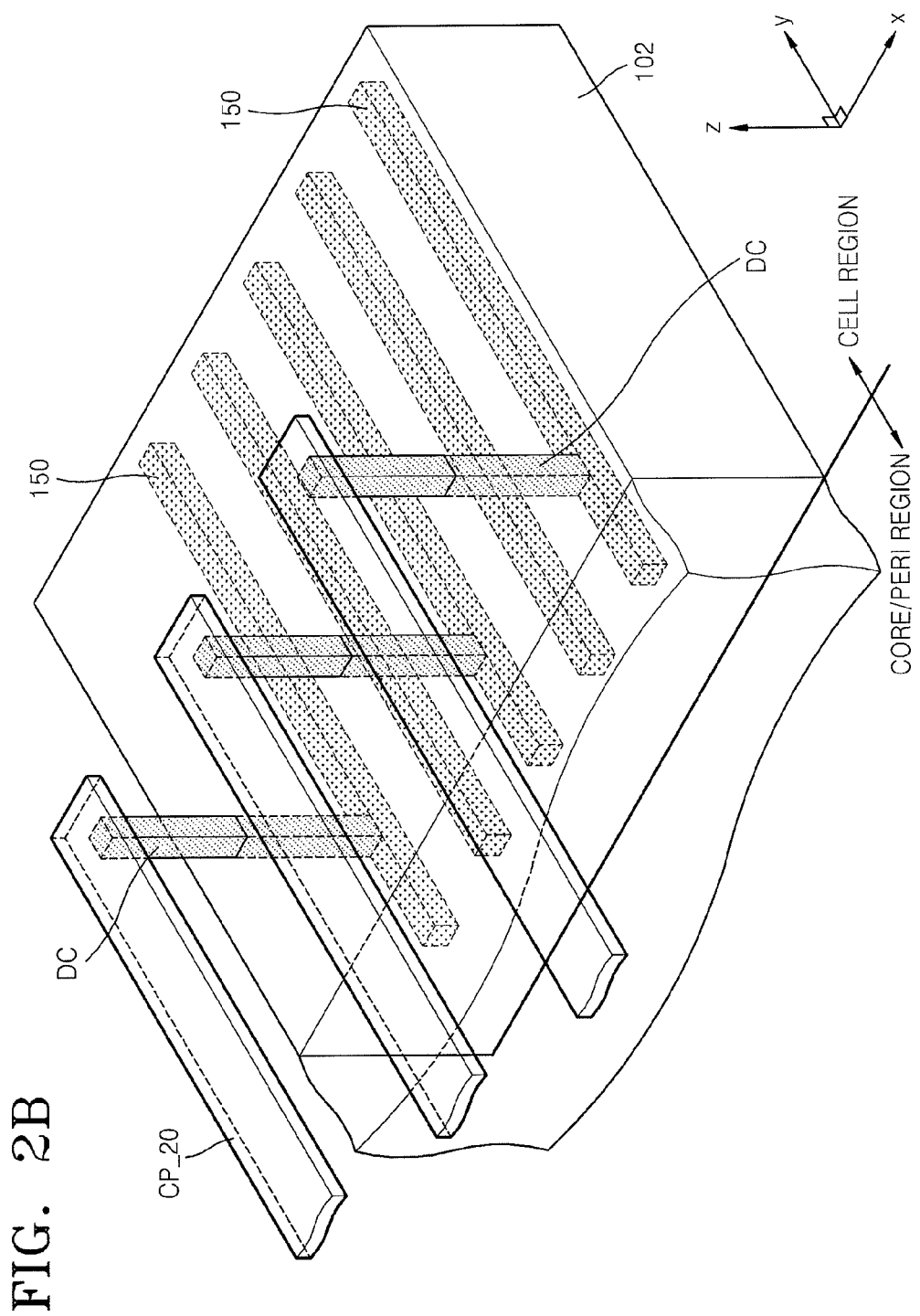
FIG. 2B is a partial perspective view illustrating an arrangement of bit lines in a semiconductor device according to an example embodiment of the inventive concept.

FIG. 2B is a partial perspective view illustrating an arrangement of bit lines in a semiconductor device according to an example embodiment of the inventive concept.

Referring to FIG. 2B, the plurality of buried bit lines 150 in a cell region (cell array region) may be connected to the core/peri bit lines CP_20 disposed in the core/peri region via the direct contact plugs DC disposed in an edge region of the cell region.

The plurality of buried bit lines 150 may be located at a lower level than the upper surface of the substrate 102, while the plurality of core/peri bit lines CP_20 may be located, for example, at a higher level than the upper surface of the substrate 102. Accordingly, the DC plugs may extend from inside the substrate 102 through the upper surface of the substrate 102 in a vertical direction with respect to the surface of the substrate 102 (e.g., the z-direction in FIG. 2B). The word lines 174WL, as illustrated in FIGS. 1 and 2B, may be disposed at a depth between a first depth at which the plurality of buried bit lines 150 are located and a second depth at which the plurality of core/peri bit lines CP_20 are located.

FIGS. 3A to 3H are cross-sectional views illustrating a method of fabricating the semiconductor device 100 of FIG. 2A, according to an exemplary embodiment of the inventive concept.

Figure 3A:
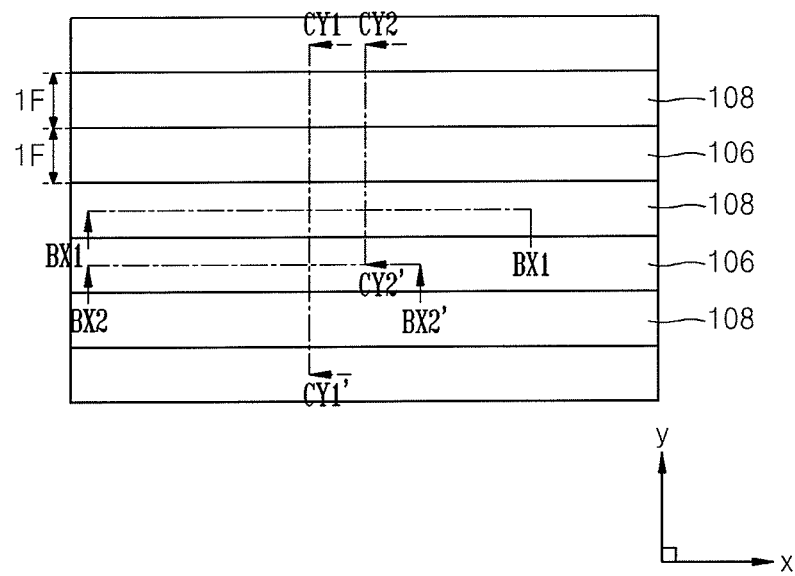
FIGS. 3A to 13B are cross-sectional views illustrating a method of fabricating the semiconductor device of FIG. 2A, according to an exemplary embodiment of the inventive concept.
Figure 3B:
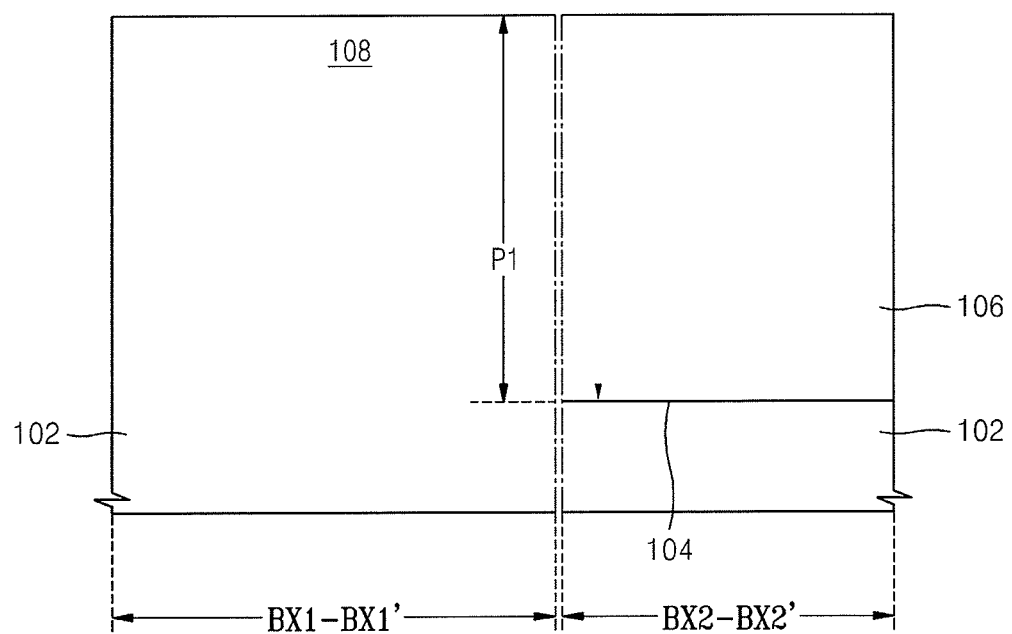
Figure 3C:
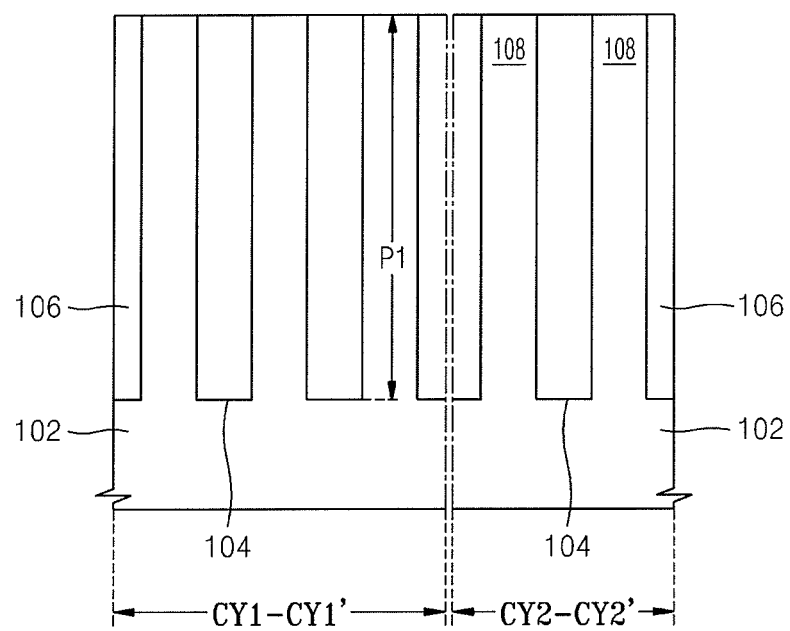

FIG. 3A is a plan view of a region corresponding to a rectangular region denoted by "P" in the layout of FIG. 1. FIG. 3B illustrates cross-sectional views taken along the lines BX1-BX1' and BX2-BX2' in FIG. 3A. FIG. 3C illustrates cross-sectional views taken along the lines CY1-CY1' and CY2-CY2' in FIG. 3A.

Referring to FIG. 3A, first device isolation layers 106 are formed in the substrate 102 as a pattern of lines to extend parallel to each other in a first direction (e.g., the x-direction in FIG. 3A) and to define first active regions 108 in the substrate 102 as a pattern of lines extending parallel to each other. The first device isolation regions 106 and the first active regions 108 may have the same width in a second direction (e.g., the y-direction in FIG. 3A), and may have a width of 1F.

The substrate 102 may be formed of, for example, silicon. To form the first device isolation layers 106, after a mask pattern (not shown) is formed on the substrate 102, a process of forming a trench 104 may be performed. After an insulating material is deposited on the substrate 102 to completely fill the trench 104, the deposited insulating material is planarized to form the first device isolation layer 106 that fills the trench 104. In an embodiment, the insulating material may be planarized using, for example, chemical mechanical polishing (CMP). Although not illustrated, the first device isolation layer 106 may have a structure including, for example, a sidewall oxide layer, a nitride liner, and a gap fill oxide layer that are sequentially disposed upon one another.

In the cross-sectional views of FIGS. 3B and 3C, the location of the bottom surface of the first device isolation layer 106 is shown. The bottom surface of the first device isolation layer 106 may be located at a first depth P1 from the upper surface of the substrate 102.

For example, an ion implantation process for forming wells in the substrate 102 may be performed before the trench 104 is formed in the substrate 102, if required. The ion implantation process for forming wells may be performed, for example, after the first device isolation layer 106 is formed.

Figure 4A:
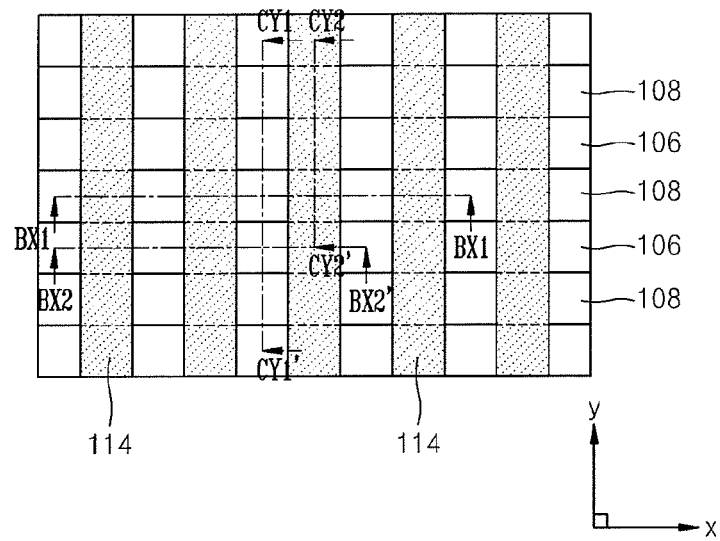
Figure 4B:
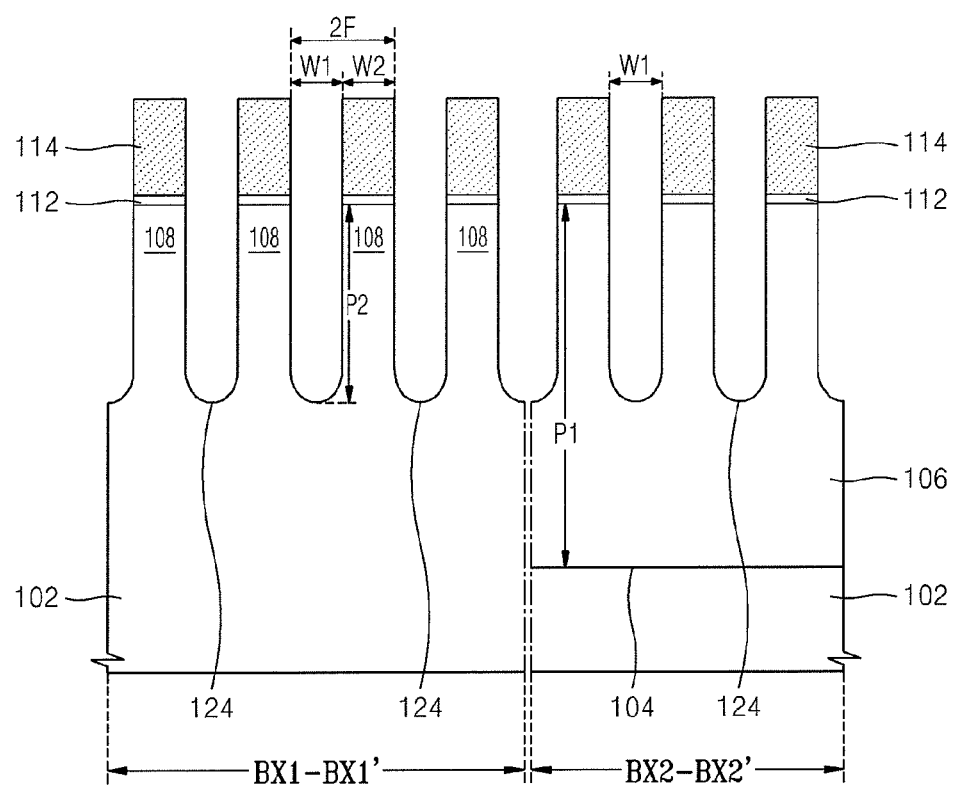
Figure 4C:
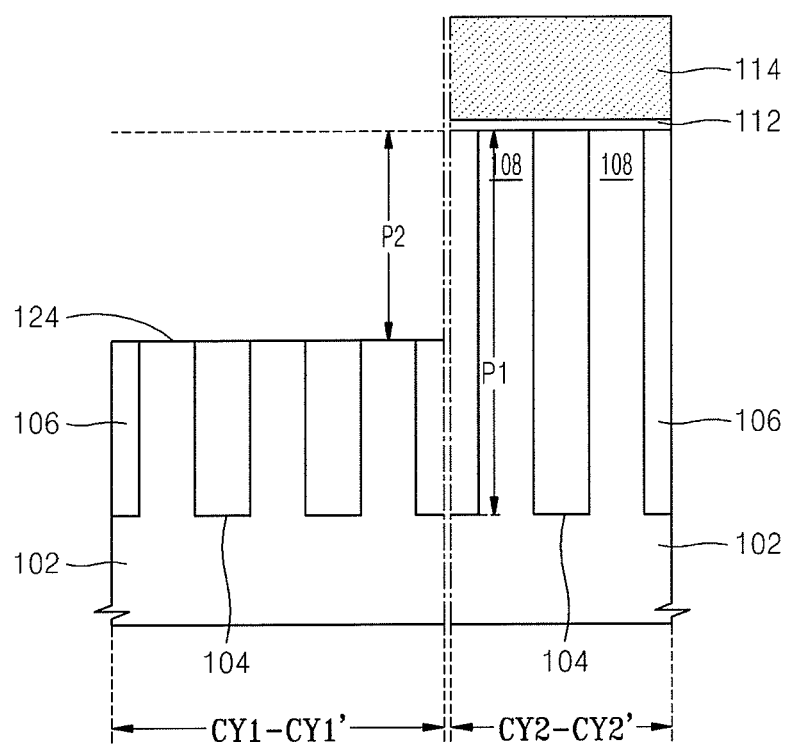

FIG. 4A is a plan view of a region corresponding to the rectangular region denoted by "P" in the layout of FIG. 1. FIG. 4B illustrates cross-sectional views taken along the lines BX1-BX1' and BX2-BX2' in FIG. 4A. FIG. 4C illustrates cross-sectional views taken along the lines CY1-CY1' and CY2-CY2' in FIG. 4A.

A pad oxide layer pattern 112 and a first mask pattern 114 are each formed on the first device isolation layer 106 and the first active region 108 as a pattern of lines extending parallel to each other in a second direction (e.g., the y-direction in FIG. 4A) perpendicular to the first direction. The first mask pattern 114 may be formed of, for example, a silicon nitride layer. In an embodiment, the first mask pattern 114 may have a multi-layer structure including, for example, a silicon nitride layer and carbon-containing layer.

Next, using the pad oxide layer pattern 112 and the first mask pattern 114 as an etch mask, portions of the first device isolation layer 106 and the first active region 108 that are exposed by the pad oxide layer pattern 112 and the first mask pattern 114 are, for example, anisotropically etched by a predetermined depth. By the etching, a plurality of bit line trenches 124 are formed in the first device isolation layer 106 and the first active region 108. The plurality of bit line trenches 124 may provide spaces for forming buried bit lines 150 (see FIGS. 12A and 12B). The bottom surfaces and sidewalls of the bit line trenches 124 expose the first active region 108 and the first device isolation layer 106.

The plurality of bit line trenches 124 may be located at a second depth P2 from the upper surface of the substrate 102 that is, for example, smaller than the first depth P1 of the first device isolation layer 106.

By forming the plurality of bit line trenches 124, the first active region 108 is divided into a plurality of active pillars 108A and 108B. Each of the active pillars 108A and 108B may constitute one unit memory cell, and may provide a vertical channel region for forming the unit memory cell.

The plurality of bit line trenches 124 may be arranged at, for example, an equal interval in the direction in which the first active regions 108 extend in the substrate 102. The width (W1) of the bit line trenches 124 in the direction in which the first active regions 108 extend may be, for example, equal to the width W2 of active pillars 108A and 108B. In an embodiment, the width W1 of the bit line trenches 124 may be, for example, greater than the width W2 of the active pillars 108A and 108B. The sum of the width W1 of the bit line trenches 124 and the width W2 of the active pillars 108A or 108B may be, for example, equal to a length of 2F.

Figure 5A:
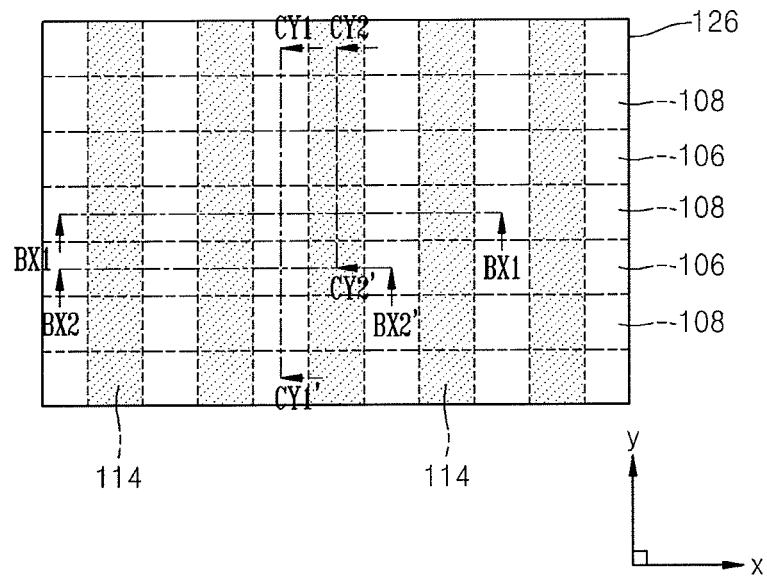
Figure 5B:
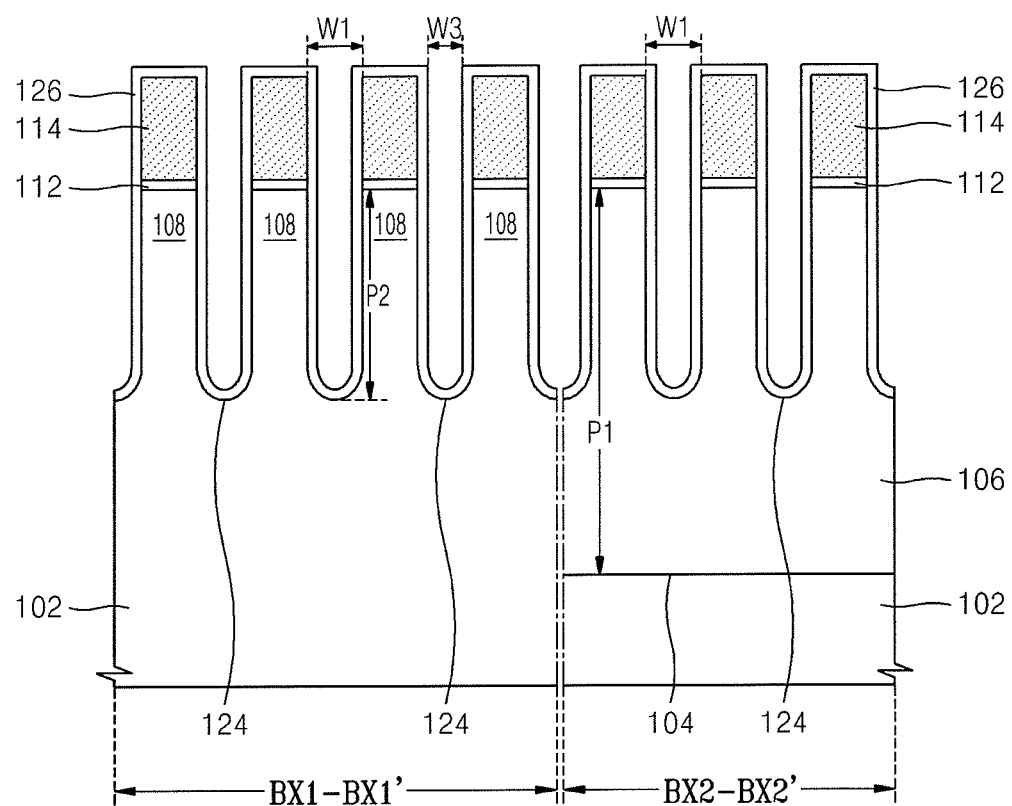
Figure 5C:
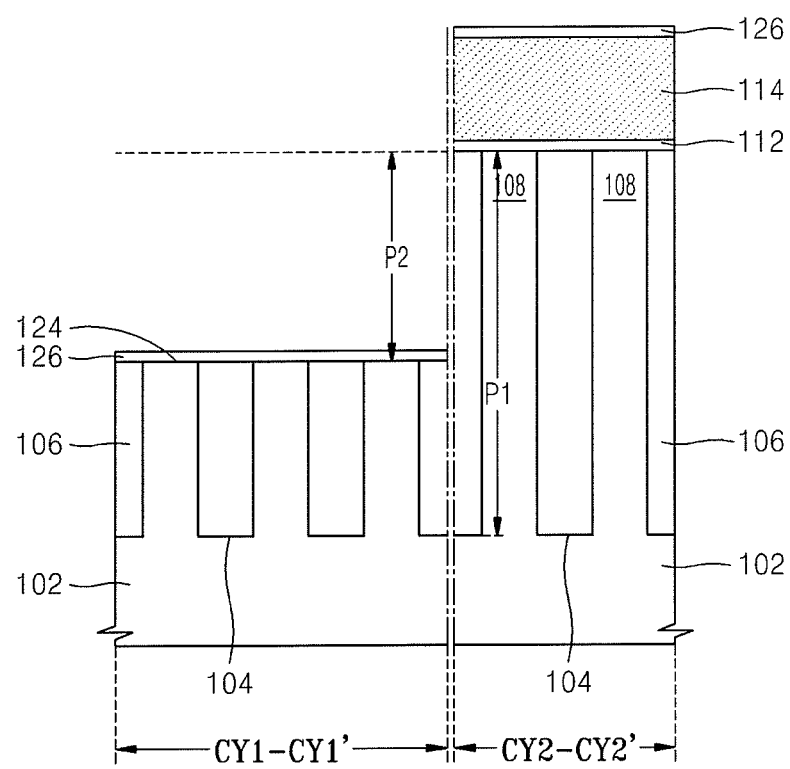

FIG. 5A is a plan view of a region corresponding to the rectangular region denoted by "P" in the layout of FIG. 1. FIG. 5B illustrates cross-sectional views taken along the lines BX1-BX1' and BX2-BX2' in FIG. 5A. FIG. 5C illustrates cross-sectional views taken along the lines CY1-CY1' and CY2-CY2' in FIG. 5A.

An insulating material is applied over the entire surface of the substrate 102 to form an insulating liner 126 on the inner wall of the bit line trenches 124. The insulating liner 126 may include, for example, silicon nitride. For example, the insulating liner 126 may have a thickness of several nanometers, and in an embodiment, may have a thickness of about 30 Å to about 90 Å. Due to the insulating liner 126, the original width W1 of the bit line trenches 124 are reduced to a width W3.

The insulating liner 126 may be formed on the bit line trenches 124, using a deposition method, for example, chemical vapor deposition (CVD), physical vapor deposition (PVD), or atomic layer deposition (ALD).

Although not illustrated, before the insulating liner 126 is formed, an oxide layer (not shown) may be formed on an exposed surface region of the substrate 102, using, for example, a radical oxidation process. By forming the oxide layer, surface defects on the first active region 108 that may occur during the etching for forming the bit line trenches 124 may be removed. The oxide layer may also relieve stress on the substrate 102 due to the insulating liner 126 or the stress of the insulating liner 126 itself.

Figure 6A:
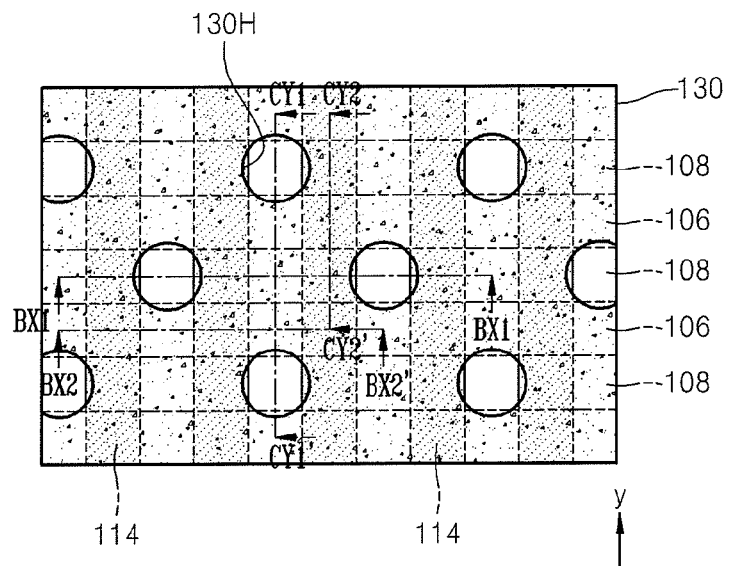

FIG. 6A is a plan view of a region corresponding to the rectangular region denoted by "P" in the layout of FIG. 1.

Figure 6B:
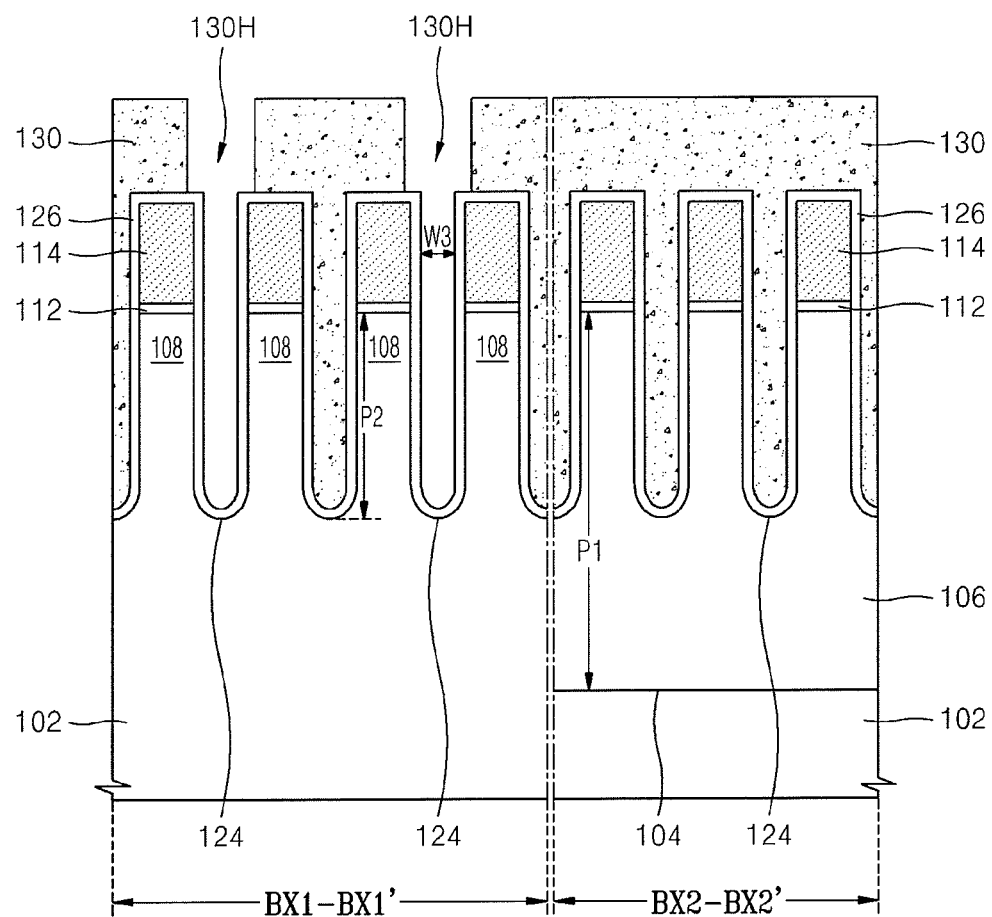
Figure 6C:
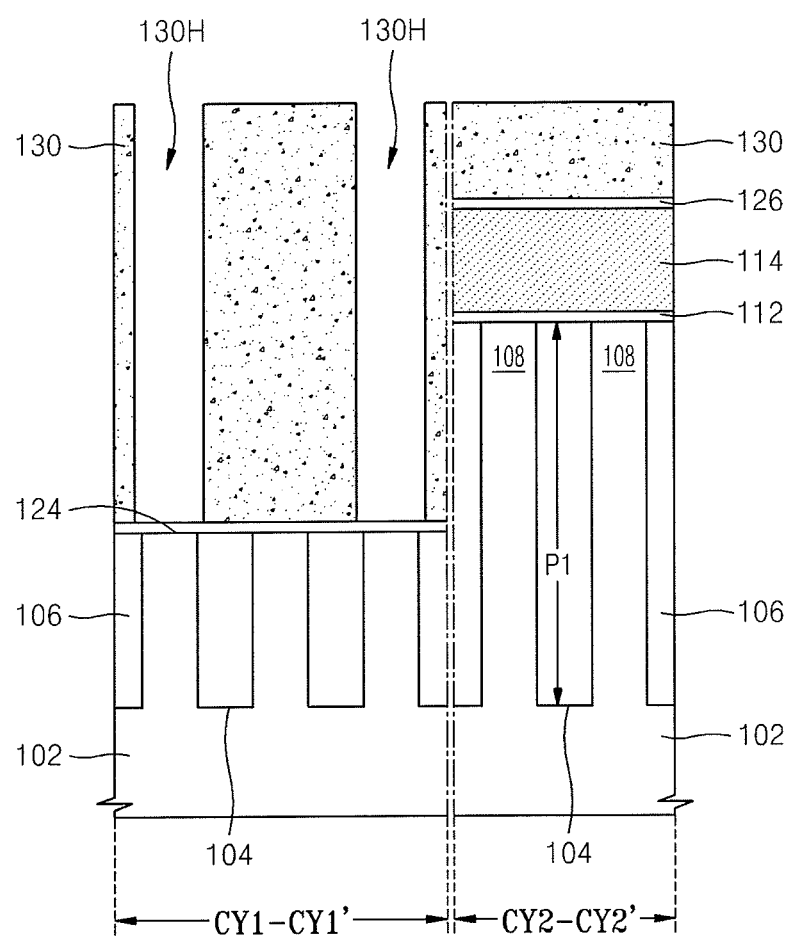

FIG. 6B illustrates cross-sectional views taken along the lines BX1-BX1' and BX2-BX2' in FIG. 6A. FIG. 6C illustrates cross-sectional views taken along the lines CY1-CY1' and CY2-CY2' in FIG. 6A.

A second mask layer is formed to fill the bit line trenches 124 and cover the first mask pattern 114 and the insulating liner 126. The second mask layer is then patterned to form a second mask pattern 130 including a plurality of openings 130H. For example, the openings 130H may be formed alternately in the bit line trenches 124 that are arranged in the direction in which the first active regions 108 extend (e.g., the x-direction in FIG. 6A). Alternatively, for example, in an embodiment, the plurality of openings 130H may be formed alternately at the intersections at which the bit line trenches 124 extending in the y-direction (in FIG. 6A) cross the first active regions 108. The openings 130H may have, for example, a circular cross-section.

The second mask pattern 130 may be formed of a carbon-containing layer, for example, a spin-on hardmask (SOH) layer.

Figure 7A:
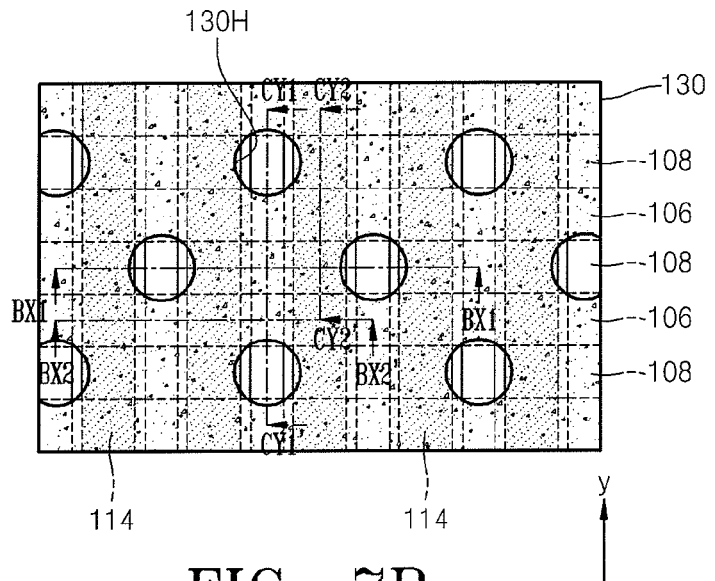
Figure 7B:
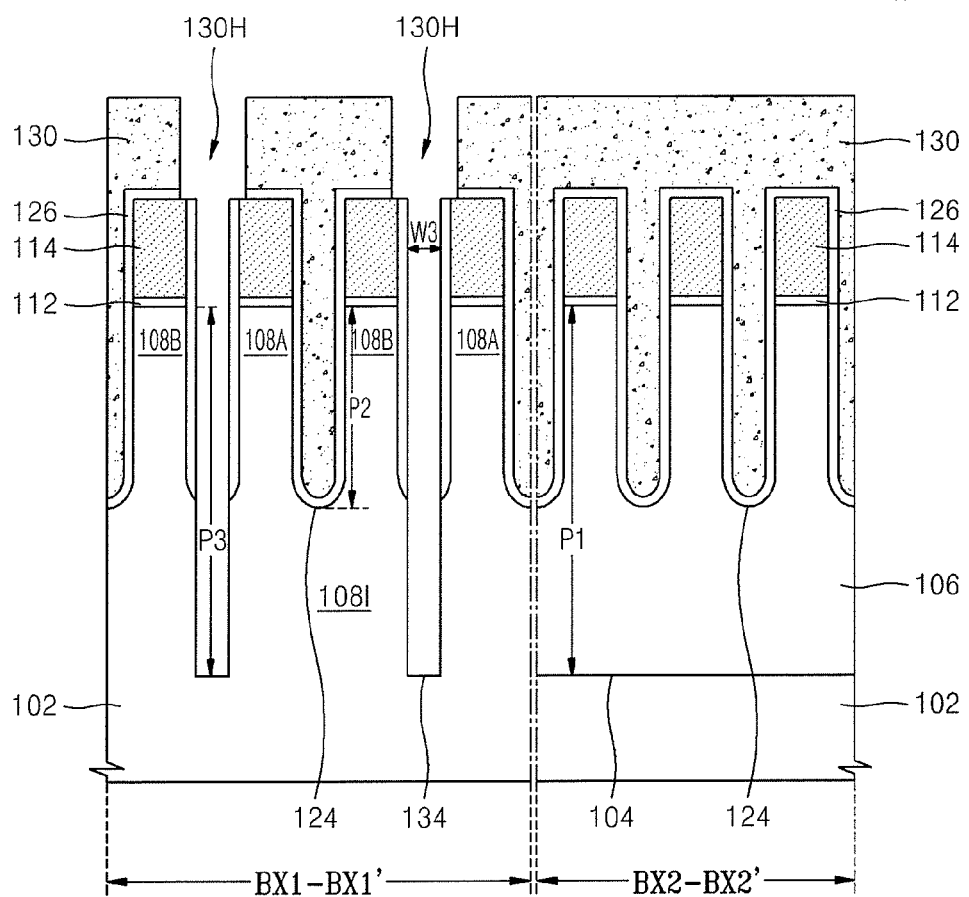
Figure 7C:
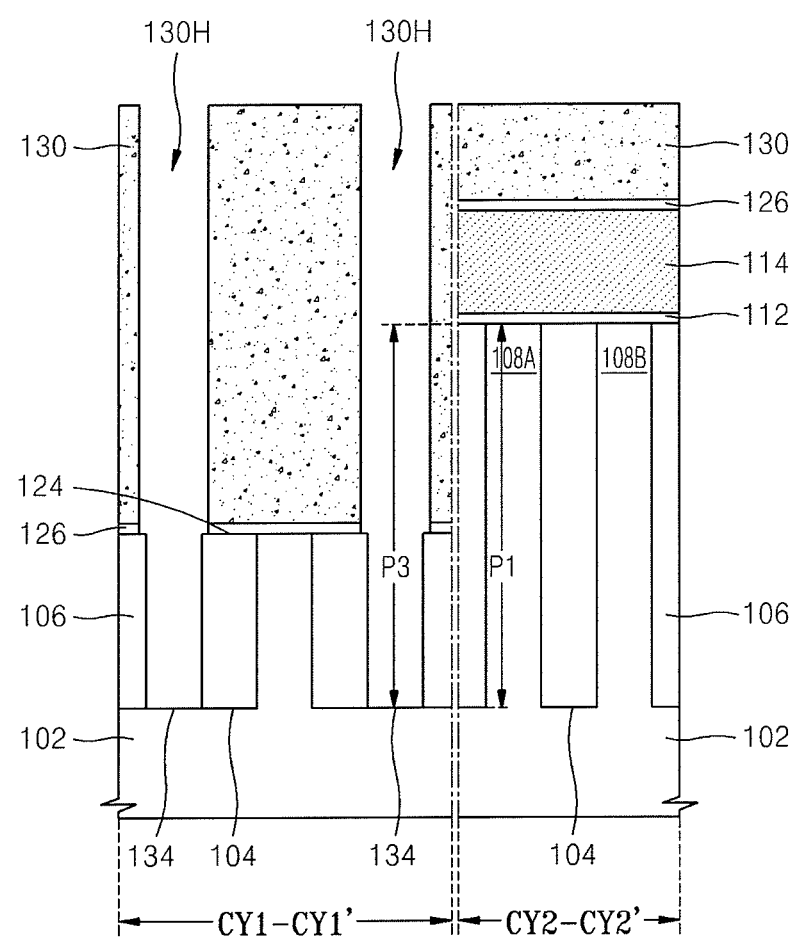

FIG. 7A is a plan view of a region corresponding to the rectangular region denoted by "P" in the layout of FIG. 1. FIG. 7B illustrates cross-sectional views taken along the lines BX1-BX1' and BX2-BX2' in FIG. 7A. FIG. 7C illustrates cross-sectional views taken along the lines CY1-CY1' and CY2-CY2' in FIG. 7A.

For example, using the second mask pattern 130 as an etch mask, portions of the insulating liner 126 on the bottom of the bit line trenches 124 that are exposed by the openings 130H, and the substrate 102 are etched, thereby resulting in the device isolation trenches 134. In other words, the device isolation trenches 134 may be formed by extending some of the bit line trenches 124 downward into the substrate 102. During the course of forming the device isolation trenches 134, portions of the insulating liner 126 on the top of the bit line trenches 124 may be removed to form the bit line trenches 124.

The etching process for forming the device isolation trenches 134 may be performed in, for example, two stages: one is to etch back the insulating liner 126, and the next one is to selectively etch the substrate 102. In an embodiment, alternatively, the insulating liner 126 and the substrate 102 may be continuously etched in one process.

The device isolation trenches 134 may be located at a third depth P3 from the upper surface of the substrate 102. The third depth P3 may be, for example, greater than the second depth P2 and equal to the first depth P1. In an embodiment, the third depth P3 may be, for example, greater than or smaller than the first depth P1. The device isolation trenches 134 and the bit line trenches 124 may have, for example, an equal width W3 due to the insulating liner 126 formed on the sidewalls thereof.

The device isolation trenches 134 alternate with the bit line trenches 124 in the direction in which the first active regions 108 extend (e.g., in the x-direction in FIG. 6A). The device isolation trenches 134 may provide spaces both for separating devices and for forming bit lines in a subsequent process.

The first active regions 108 as a pattern of lines are trimmed by the device isolation trenches 134 into a plurality of second active regions 108I, each of which includes two pillars 108A and 108B. In other words, the first active regions 108 are divided into the plurality of second active regions 108I having, for example, an island shape.

By the device isolation trenches 134, formed as described above, the first active regions 108 as a pattern of lines are divided into the second active regions 108I having, for example, an island shape. Comparing with the forming of active regions as islands by patterning using photolithography, difficulties such as corner rounding in the active regions do not arise, and thus active regions having a constant width in the y-direction in FIG. 7A may be formed. The active pillars 108A and 108B grouped by two by the device isolation trenches 134 may have, for example, a constant length in the x-direction in FIG. 7A. Consequently, this allows for the fabrication of a semiconductor device having a constant channel width.

Figure 8A:
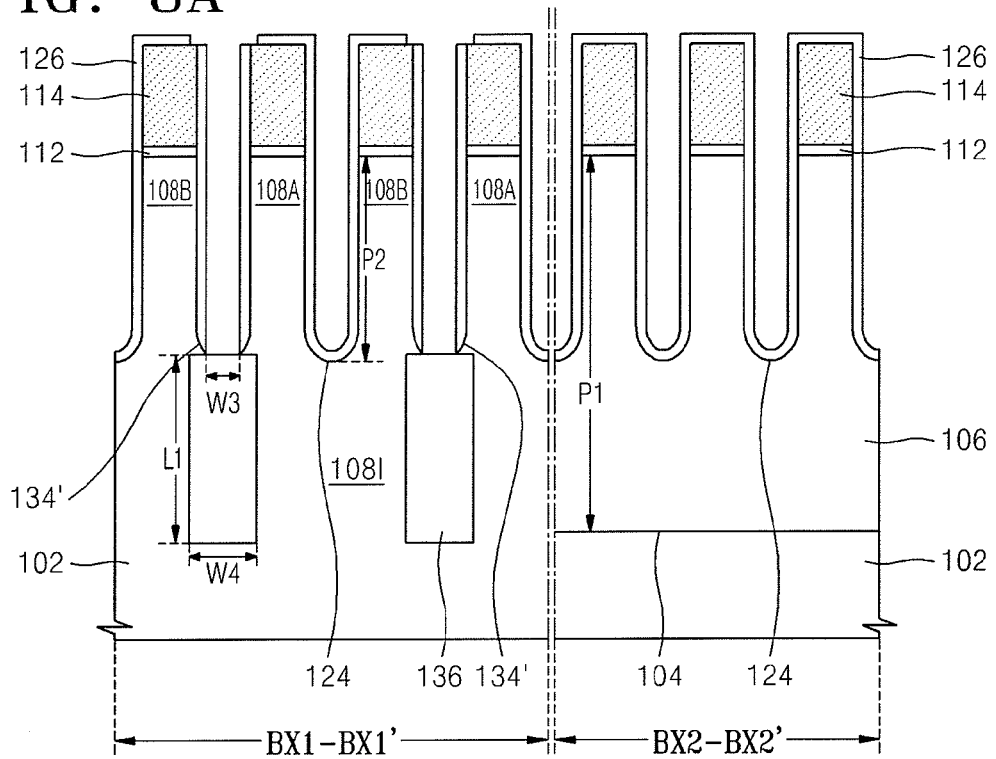
Figure 8B:
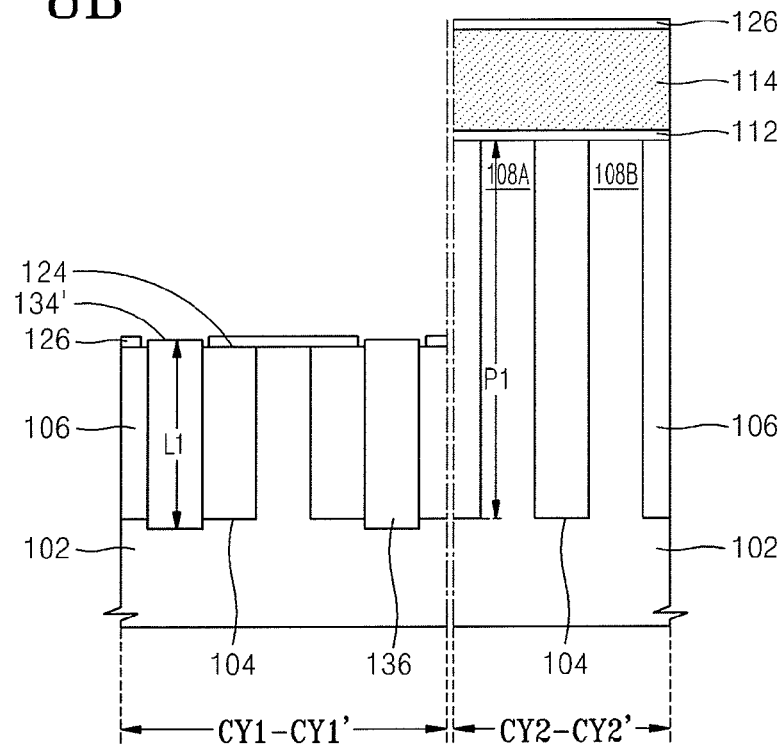

Referring to FIGS. 8A and 8B, after the second mask pattern 130 is removed, second device isolation layers 136 are formed in a lower portion of the device isolation trenches 134. Hereinafter, the device isolation trenches that remain above the second device isolation layers 136 and have smaller depth than before the second device isolation layers 136 are formed are denoted by reference numeral 134'.

The second device isolation layers 136 may be formed through, for example, an oxidation process performed on the substrate 102. For example, when the substrate 102 is a silicon substrate, and the insulating liner 126 is formed of a silicon nitride layer, the second device isolation layers 136 may include a silicon oxide layer formed from oxidation of the substrate 102. The oxidation process may be performed according to the same principle as, for example, local oxidation of silicon (LOCOS). That is, only exposed portions of the substrate 102 may be oxidized using the insulating liner 126 as an anti-oxidation layer. To form the second device isolation layers 136 to be large enough to fill the device isolation trenches 134 having the width W3, portions of the second active regions 108I of the substrate 102 that define the sidewall and bottom of the device isolation trenches 134 may be oxidized.

During the oxidation process for forming the second device isolation layers 136, portions of the substrate 102 around the device isolation trenches 134 may be converted into oxide layers by oxidation to a substantially equal extent both inwards and outwards from the device isolation trenches 134. For example, the second device isolation layers 136 may have a width W4 that is greater than the width W3 of the device isolation trenches 134. In an embodiment, the width of the second device isolation layers 136 may be, for example, about twice the width W3 of the device isolation trenches 134. The second device isolation layers 136 may have a predetermined length L1. The bottom of the second device isolation layers 136 may be, for example, lower than the bottom of the device isolation trenches 134'. That is, the bottom of the second device isolation layer 136 may be located at a depth, for example, greater than the depth P1 of the first device isolation layers 106.

In an embodiment, the bottom of the second device isolation layers 136 may be located at a depth higher or lower than the bottom of the first device isolation layer 106 having the depth P1, according to the depth of the device isolation trenches 134. The upper surface of the second device isolation layers 136 in the device isolation trenches 134' may be, for example, substantially coplanar with the bottom of the bit line trenches 124.

As described above, the second device isolation layers 136 may be defined in the device isolation trenches 134' that are of a micro size, using a simple process. The second device isolation layers 136 may be defined in portions of the device isolation trenches 134' that are immediately below buried bit lines 150, which are formed in a subsequent process below (see FIGS. 12A and 12B).

Figure 9A:
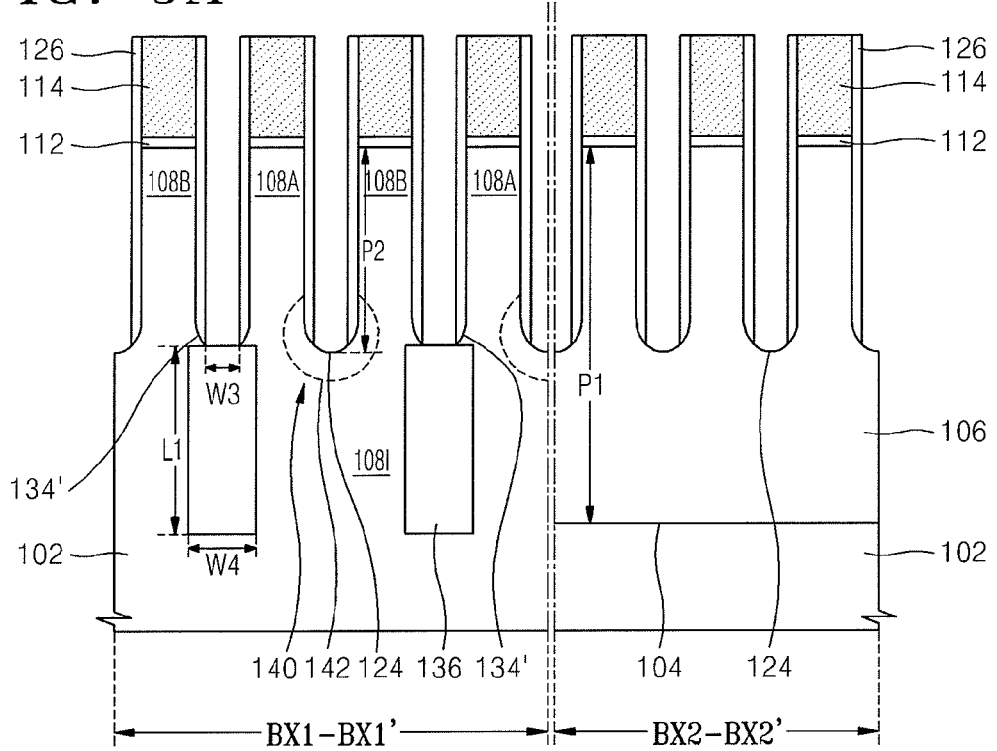
Figure 9B:
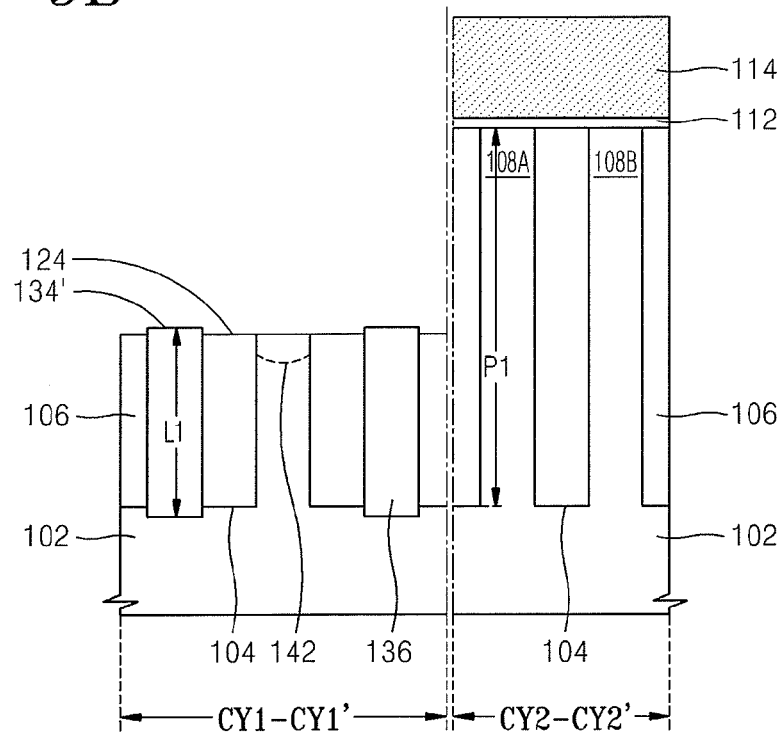

Referring to FIGS. 9A and 9B, to form first source/drain regions 140 in the second active region 108I around the bottoms of the bit line trenches 124, for example, an ion implantation process is performed on the entire surface of the substrate 102. To this end, a process of removing the insulating liners 126 from the bottoms of the bit line trenches 124 may be performed.

The insulating liners 126 may be etched back to remain only on the inner sidewalls of the bit line trenches 124. Accordingly, portions of the second active region 108I that are under the bit line trenches 124 are exposed by the bit line trenches 124 in an active region of the substrate 102, while portions of the first device isolation layer 106 that are under the bit line trenches 124 are exposed by the bit line trenches 124 in a device isolation region of the substrate 102.

Next, for example, an ion implantation process is performed to define lightly-doped dopant regions 142 near the bottom of the bit line trenches 124 in the second active region 108I. For example, the lightly-doped dopant regions 142 may be formed by implanting N-type impurity ions. However, exemplary embodiments of the inventive concept are not limited thereto. In an embodiment, alternatively, the lightly-doped dopant regions 142 may be formed by implanting P-type impurity ions. To form the lightly-doped dopant regions 142 may be optional. The lightly-doped dopant regions 142 may not be formed depending on the characteristics of a desired device.

Figure 10A:
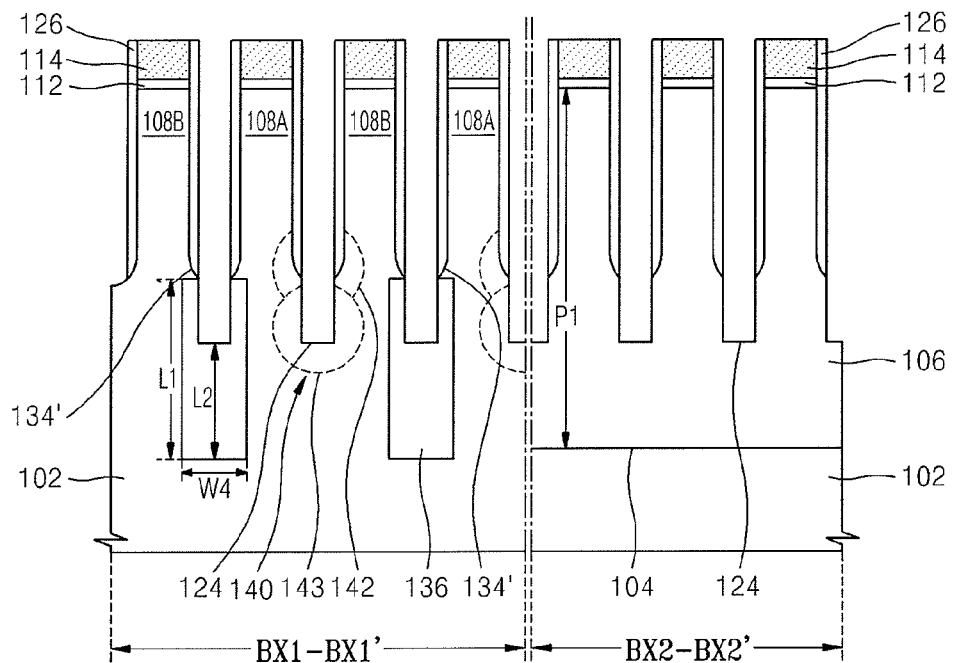
Figure 10B:
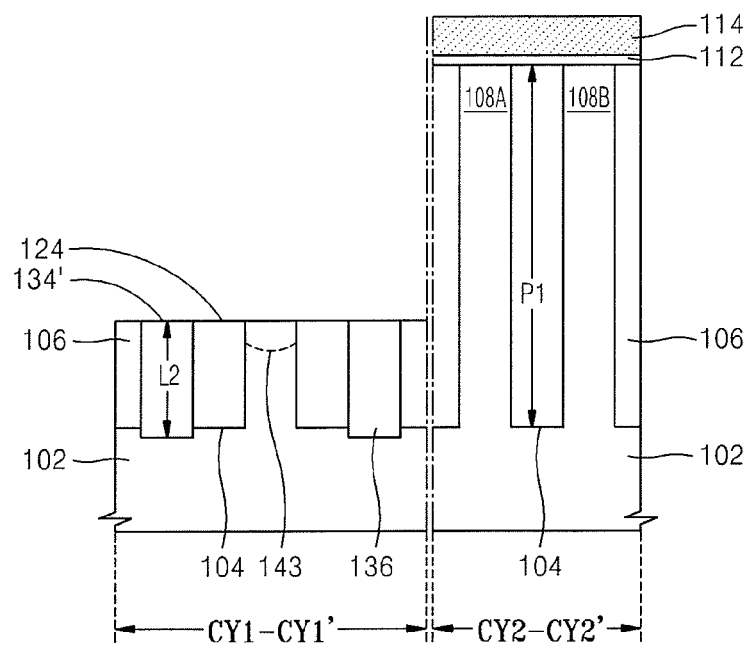

Referring to FIGS. 10A and 10B, portions of the second active region 108I below the bit line trenches 124 and the device isolation trenches 134', the first device isolation layer 106, and the second device isolation layer 136 may be partially removed to extend the bit line trenches 124 and the device isolation trenches 134'. After the removing process, only a predetermined length L2 of the second device isolation layer 136 may remain below each of the device isolation trenches 134'. During the removing process, the first mask pattern 114 on the active pillars 108A and 108B and the first device isolation layer 106 may be partially removed to have a lower height.

The removing process may be performed, for example, as one process using an etchant that has substantially the same etch selectivity with respect to the second active region 108I, the first device isolation layer 106, and the second device isolation layers 136. Alternatively, in an embodiment, the removing process may be performed in sequential two or three stages. The removing process may involve, for example, etching the second active region 108I, and then etching the first device isolation layer 106 and the second device isolation layers 136.

When the first device isolation layer 106 and the second device isolation layers 136 are formed of the same material, the bit line trenches 124 may have a different depth from the device isolation trenches 134', according to the type of the etchant used in the removing process. In this regard, in a process for forming the buried bit lines 150, which will be described with reference to FIGS. 11A and 11B, the thicknesses of the buried bit lines 150 may need to be adjusted to fill both the bit line trenches 124 and the device isolation trenches 134 that have different depths.

Next, for example, an ion implantation process is performed using the first mask pattern 114 as an ion implantation mask to define heavily-doped dopant regions 143 in portions of the second active region 108I that are exposed by the bottom and sidewall of the device isolation trenches 134', as the first source/drain regions 140. The heavily-doped dopant region 143 may include, for example, the same type of impurity ions as the lightly-doped dopant region 142. For example, the heavily-doped dopant region 143 may include N-type impurity ions. As a result, the first source/drain regions 140 may be defined around a lower portion of the bit line trenches 124 in the second active region 108I of the substrate 102.

Figure 11A:
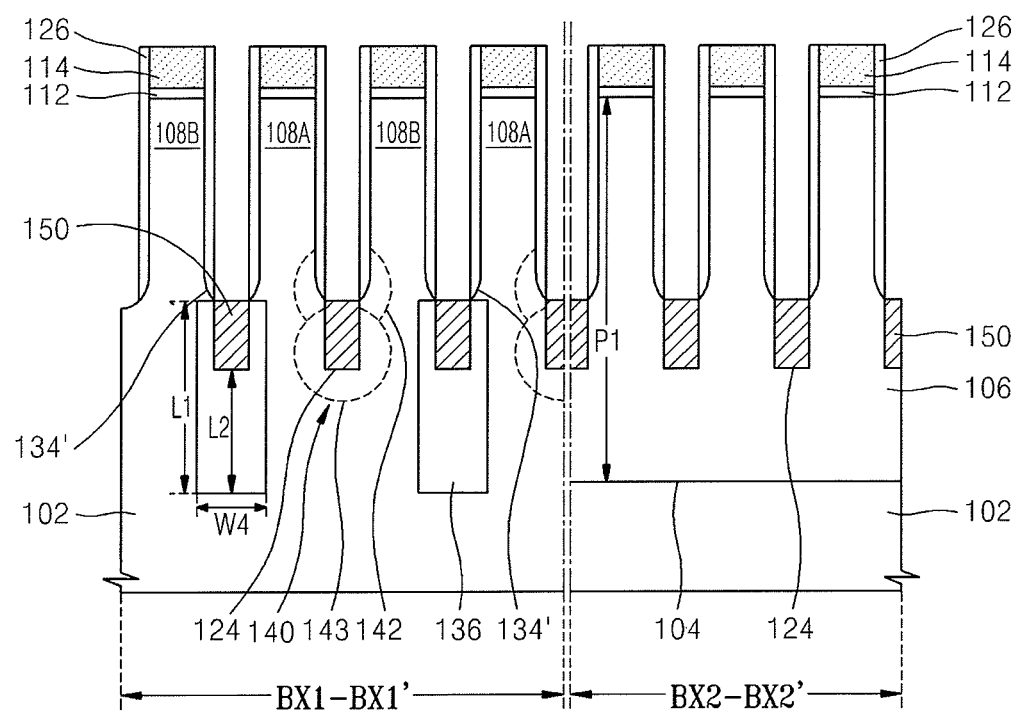
Figure 11B:
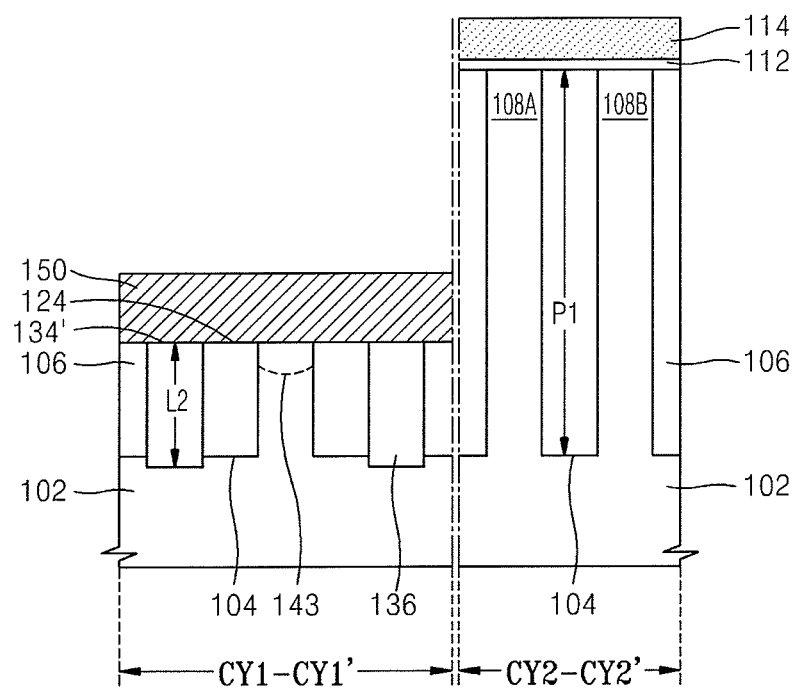

Referring to FIGS. 11A and 11B, a conductive material is deposited on the resultant structure in which the first source/drain regions 140 are formed, to form a conductive layer (not shown) that fills the bit line trenches 124 and the device isolation trenches 134'. Next, the conductive layer is partially removed by etching back to remain only in lower portions of the bit line trenches 124 and the device isolation trenches 134' to form a plurality buried bit lines 150 therein.

Each of the buried bit lines 150 extends between the two active pillars 108A and 108B in one second active region 108I. Two unit memory cells respectively including the two active pillars 108A and 108B in one second active region 108I share one buried bit line 150 and one first source/drain region 140 formed near the bottom of the buried bit line 150. That is, in one active pillar 108A of one second active region 108I, one vertical channel may be formed between the second source/drain region 160 (see FIG. 2) on the upper surface of the active pillar 108A, and the first source/drain region 140. In the other active pillar 108B of the second active region 108I, one vertical channel may be formed between the second source/drain region 160 (see FIG. 2A) on the upper surface of the active pillar 108B, and the first source/drain region 140.

The buried bit lines 150 may include, for example, a metal, a metal nitride, or a combination thereof. For example, the buried bit lines 150 may include at least one metal selected from the group consisting of tungsten (W), aluminum (Al), copper (Cu), molybdenum (Mo), titanium (Ti), tantalum (Ta), and ruthenium (Ru). In an embodiment, the buried bit lines 150 may include, for example, at least one metal nitride selected from the group consisting of titanium nitride (TiN), titanium nitride/tungsten (TiN/W), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN). The plurality of buried bit lines 150 may have, for example, a multi-layer structure including a diffusion barrier layer (not shown).

The upper surfaces of the buried bit lines 150 may be located at a second depth P2 (see FIG. 9A). In an embodiment, the upper surfaces of the buried bit lines 150 may be located at a depth higher or lower than the second depth P2. In either case, the upper surface of the buried bit lines 150 may be, for example, lower than the upper surface of the substrate 102, and the lower surface of the buried bit lines 150 may be higher than the lower surface of the second device isolation layers 136.

A lower surface of the buried bit lines 150 located in the second active region 108I, a lower surface of the buried bit lines 150 located on the first device isolation layers 106, and a lower surface of the buried bit lines 150 located on the second device isolation layers 136 may be located, for example, at a substantially same depth and be substantially the same distance from the upper surface of the substrate 102. Alternatively, in an embodiment, regarding the processes described with reference to FIGS. 10A and 10B, the lower surfaces of the buried bit lines 150 may be located at, for example, different depths according to the degrees by which the first device isolation layers 106, the second device isolation layers 136, and the second active region 108I of the substrate 102 are etched back. In this regard, a conductive layer covering the resultant structure may be etched back to an equal depth, so that the buried bit lines 150 defined in the second active regions 108I, and the buried bit lines 150 on the second device isolation layers 136 may have different heights.

Figure 12A:
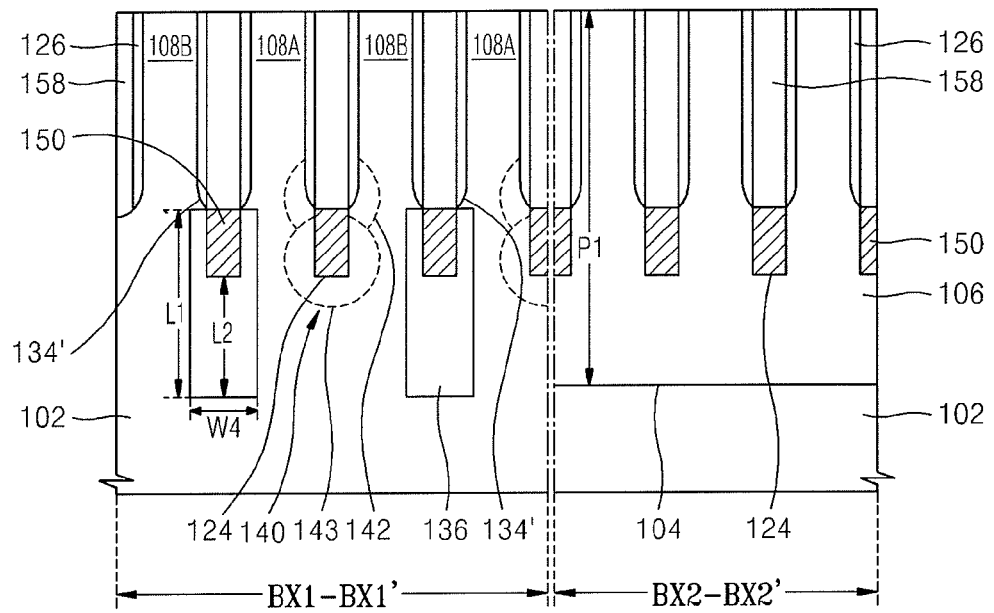
Figure 12B:
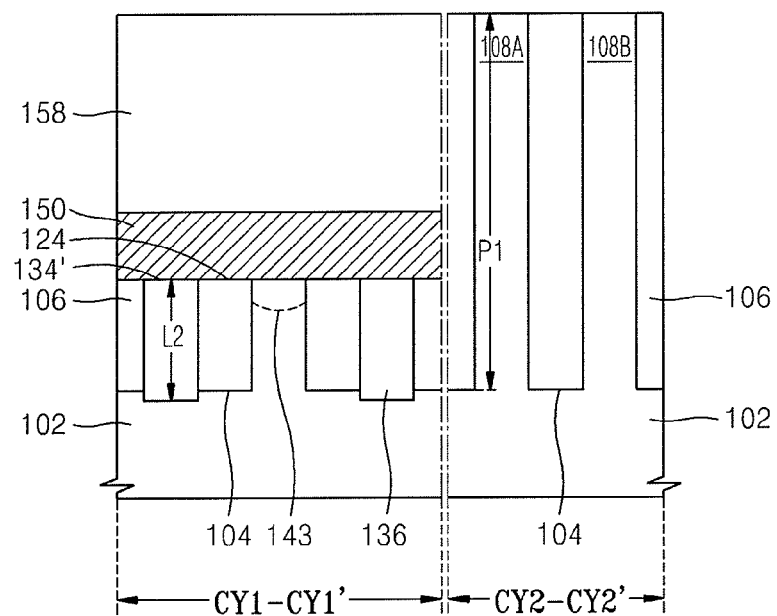

Referring to FIGS. 12A and 12B, after an insulating material is deposited on the resultant structure in which the buried bit lines 150 are formed, to completely fill the spaces in the bit line trenches 124 and the device separation trenches 134', a planarization process is performed thereon using, for example, a chemical mechanical polishing (CMP) process until the upper surface of the substrate 102 is exposed, thereby forming insulating layers 158 that fill the bit line trenches 124 and the device isolation trenches 134' above the buried bit lines 150. The insulating layers 158 may be formed of, for example, a silicon nitride layer or a silicon oxide layer. During the CMP process, the second mask pattern 114 and the pad oxide layer pattern 112 on the substrate 102 may be removed. Alternatively, in an embodiment, after the second mask pattern 114 and the pad oxide layer pattern 112 are removed using a separate process, the insulating layers 158 may be formed.

Each of the insulating layers 158 covers the corresponding bit line 150 between the two active pillars 108A and 108B in one of the second active regions 108I. The insulating layers 158 extend above and parallel to the buried bit lines 150 across the plurality of active regions 108 through the inner spaces in the bit line trenches 124 and the device isolation trenches 134'.

Figure 13A:
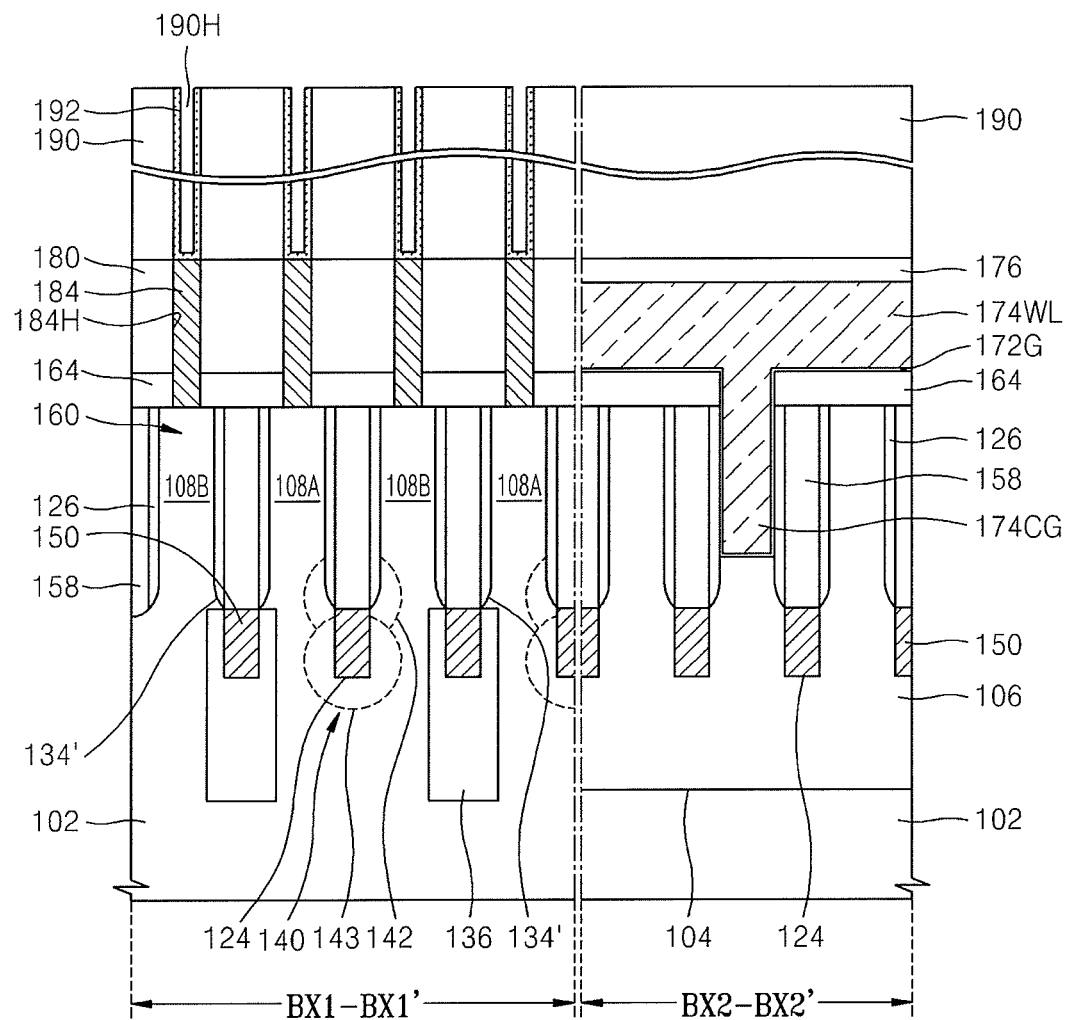
Figure 13B:
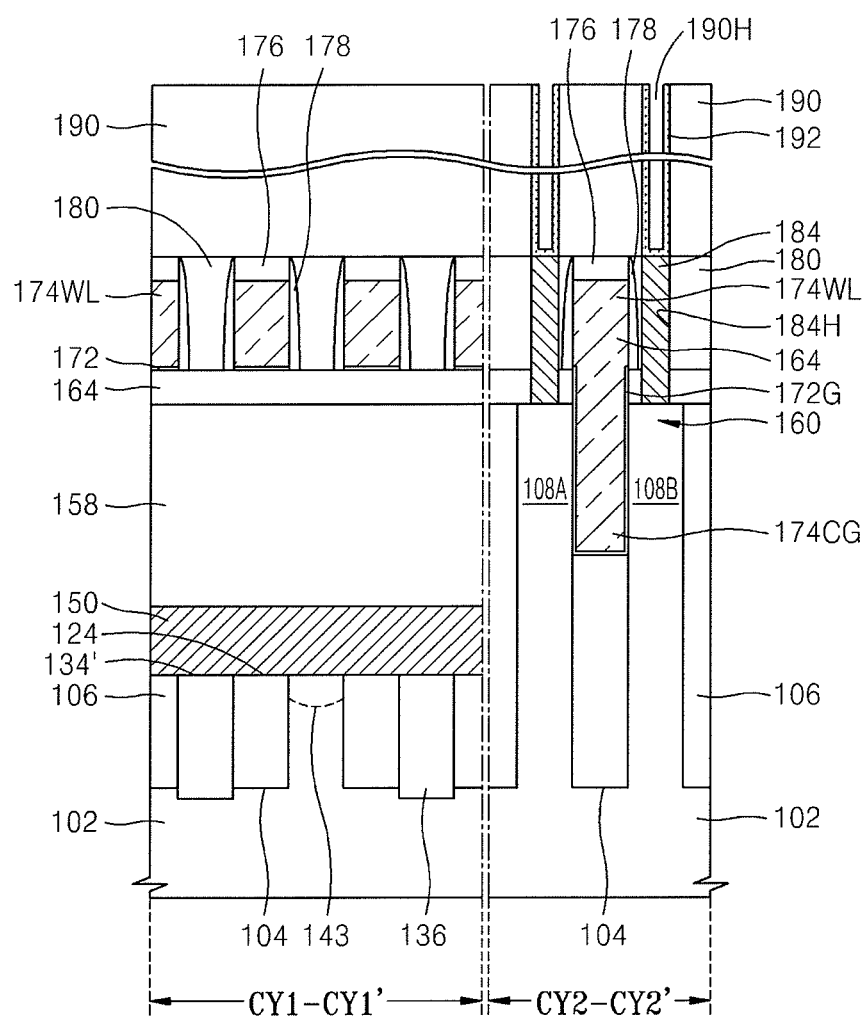

Referring to FIGS. 13A and 13B, after the buried bit lines 150 are formed, a process for forming contact gates 174CG and word lines 174WL may be performed. After the insulating layers 158 are formed, for example, an ion implantation process may be formed on the upper surface of the active pillars 108A and 108B to form second source/drain regions 160.

After the oxide layer pattern 164 is formed on the insulating layers 158, contact gate recesses (not shown) are formed in regions where the contact gates 30CG (see FIG. 1) are to be formed. Then, an insulating material is applied to form a gate insulating layer 172G on the inner wall of each of the contact gate recesses and on the oxide layer pattern 164, and a conductive layer (not shown) is formed thereon to fill the inner space of the contact gate recess and cover the entire upper surface of the substrate 102. Next, after a capping insulating layer pattern 176 is formed on the conductive layer, a plurality of word lines 174WL that extend parallel to each other are formed.

One contact gate 174CG is located between each two neighboring active regions 108I in a direction between the x- and y-directions of FIG. 1, for example, in the diagonal line (DL) direction in FIG. 1. A unit memory cell including one active pillar 108A of one of the two neighboring second active regions 108I, and a unit memory cell including one active pillar 108B of the other second active region 108I share one contact gate 174CG.

Next, a process for forming buried contact holes 184H and capacitor lower electrodes 192 may be performed.

Insulating spacers 178 are formed on opposite sidewalls of the word lines 174WL and the capping insulating layers 176. The insulating spacers 178 may be formed of, for example, a silicon nitride layer. Then, a planarization insulating layer 180 is formed on the entire surface of the substrate 102 in which the insulating spacers 178 are formed, to planarize the surface of the substrate 102. The planarization insulating layer 180 and the capping insulating layers 176 are partially etched until the oxide layer pattern 164 is exposed. Then, the oxide layer pattern 164 is etched to form the plurality of buried contact holes 184H.

After being formed to completely fill the inner spaces of the buried contact holes 184H, a conductive layer is planarized until the upper surface of the planarization insulating layer 180 is exposed, thereby forming the plurality of buried contact plugs 184 in the buried contact holes 184H.

The conductive layer for forming the buried contact plugs 184 may be formed of, for example, doped polysilicon. For example, when a doped polysilicon is deposited into the plurality of buried contact holes 184H to form the plurality of buried contact plugs 184, dopants in the polysilicon may diffuse into upper portions of the second active regions 108I that are exposed by the buried contact holes 184, and thus define second source/drain regions 160, which are implanted with the dopant ions, in the upper regions of the second active regions 108I.

The capacitor lower electrodes 192 that are electrically connected to the plurality of buried contact plugs 184 are formed on the buried contact plugs 184, respectively. After a sacrificial insulating layer pattern 190 with a plurality of storage node holes 190H is formed, the capacitor lower electrodes 192 are formed in the plurality of storage node holes 190H to respectively contact the buried contact plugs 184.

Next, although not illustrated, the sacrificial insulating layer pattern 190 is removed, after the sacrificial insulating layer pattern 190 is removed, dielectric layers and capacitor upper electrodes are formed on the capacitor lower electrodes 192, thereby forming a plurality of capacitors.

In the methods for fabricating a semiconductor device according to exemplary embodiments of the inventive concept, even when an erroneous misalignment occurs in photolithography during the processes for forming the plurality of bit line trenches 124 and the plurality of device isolation trenches 134, the active pillars 108A and 108B may have a constant length in the plurality of second active regions 108I. That is, since the plurality of device isolation trenches 134 are formed in the first active regions 108 defined as a pattern of lines, variations in length of the active pillars 108A and 108B, which may be caused by a misalignment, may be reduced. Accordingly, the contact gates 174CG may have a constant channel width. Therefore, electrical characteristic variations may be reduced between a plurality of unit memory cells formed in the substrate 102.

In addition, since the buried bit lines 150 are formed within the second device isolation layers 136 using self-aligning, an electrical short is less likely to occur between the buried bit lines 150 in the second device isolation layers 136, and the second active regions 108I adjacent to the second device isolation layers 136.

Figure 14:
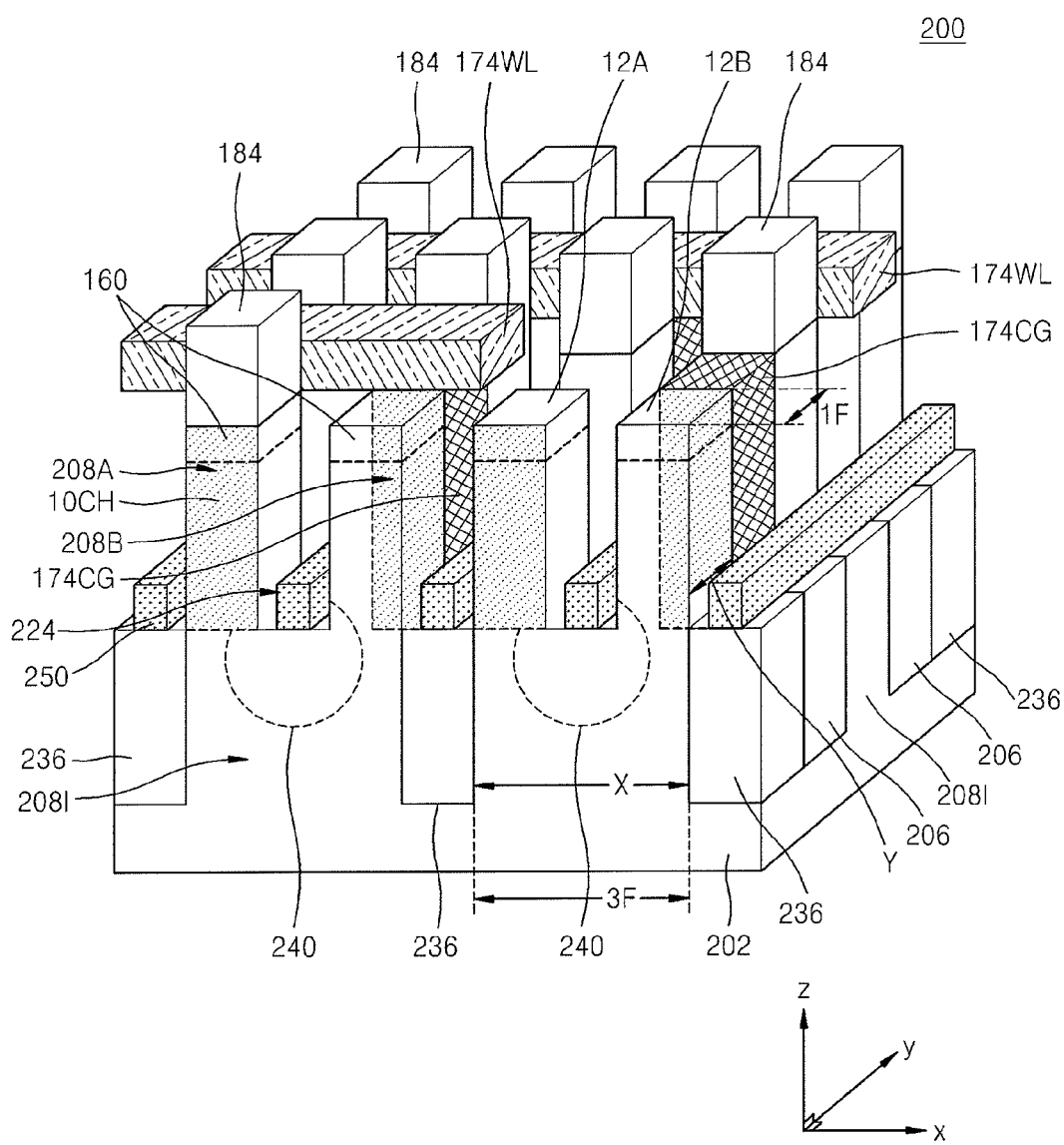
FIG. 14 is a partial perspective view of a 3D arrangement of components constituting a cell array region of a semiconductor device, according to an exemplary embodiment of the inventive concept.

FIG. 14 is a partial perspective view of a three-dimensional (3D) arrangement of components constituting a cell array region of a semiconductor device 200, according to an exemplary embodiment of the inventive concept. In FIG. 14, like reference numerals as those used in FIG. 2B denote like elements. A redundant detailed description of those elements will not be provided.

Referring to FIG. 14, the semiconductor device 200 includes a plurality of active regions 208I (corresponding to the second active regions 208I in FIGS. 15A and 15B) that may be defined as, for example, islands on a substrate 202 by first device isolation layers 206 and second device isolation layers 236. The plurality of active regions 208I may be each divided into two active pillars 208A and 208B in an upper portion of the substrate 102 by a trench 224 (corresponding to the bit line trenches 224 in FIGS. 15A and 15B). The trench 224 is recessed from an upper center region of each of the active regions 208I to a predetermined depth. A first source/drain region 240 is defined in a region of each active region 208I where the two active pillars 208A and 208B diverge. Second source/drain regions 260 may be respectively formed on the upper surfaces 12A and 12B of the active pillars 208A and 208B.

A plurality of buried bit lines 250 may be each located on a bottom of the trench 224 by which one active region 208I is divided into the two active pillars 208A and 208B. The plurality of buried bit lines 250 may extend in the shorter axis (Y) direction of the active regions 208I to cross over the active regions 208I, the first device isolation layers 206, and the second device isolation layers 236.

The buried bit lines 250 may be disposed on the upper surfaces of the second device isolation layers 236. Accordingly, the lower surface of the buried bit lines 250 may contact the upper surface of the second device isolation layers 236. In this regard, a method of forming the buried bit lines 250 is described below with reference to FIGS. 15A and 15B.

The two active pillars 208A and 208B of each active region 208I may each have a vertical surface 10CH that functions as a surface of a vertical channel. The vertical surfaces 10CH may face contact gates 174CG.

The lower surface of the contact gates 174CG may be, for example, coplanar with the upper surface of the buried bit lines 250 on the substrate 202. In an embodiment, a distance from the upper surfaces 12A and 12B of the active pillars 208A and 208B, which correspond to the upper surface of the substrate 202, to the lower surface of the contact gates 174CG may be, for example, equal to a distance from the upper surfaces 12A and 12B of the active pillars 208A and 208B to the upper surface of the buried bit lines 250.

A plurality of word lines 174WL may extend parallel to each other in a direction (e.g., the x-direction in FIG. 14) perpendicular to the direction in which the plurality of buried bit lines 250 extend. The plurality of word lines 174WL may be electrically connected to the plurality of contact gates 174CG that are arranged in a line along the extension direction of each of the word lines 174WL.

Figure 15A:
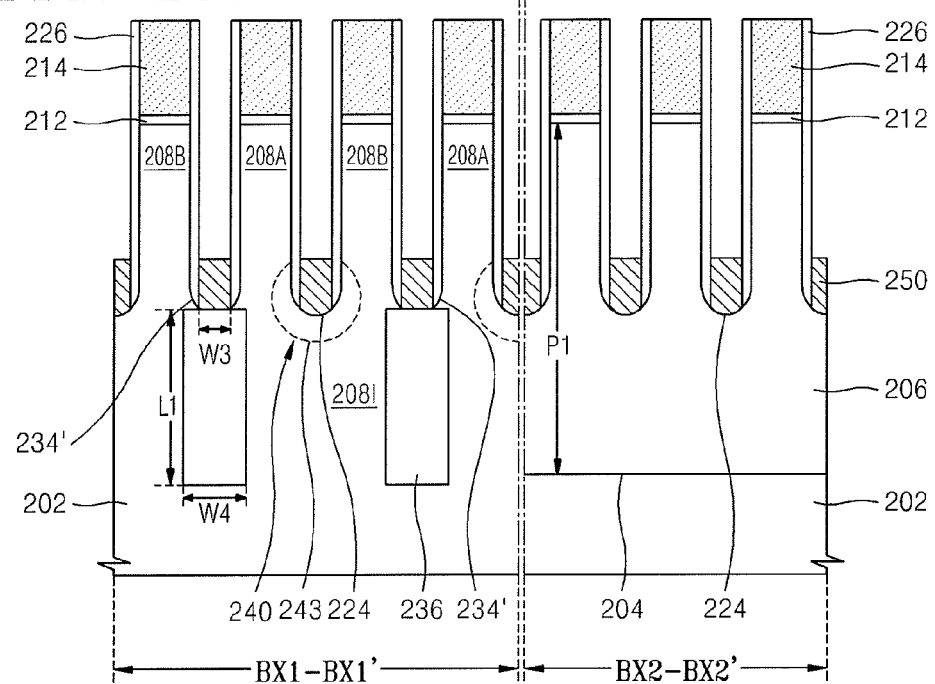
FIGS. 15A to 15B are cross-sectional views illustrating a method of fabricating the semiconductor device of FIG. 14, according to an exemplary embodiment of the inventive concept.
Figure 15B:
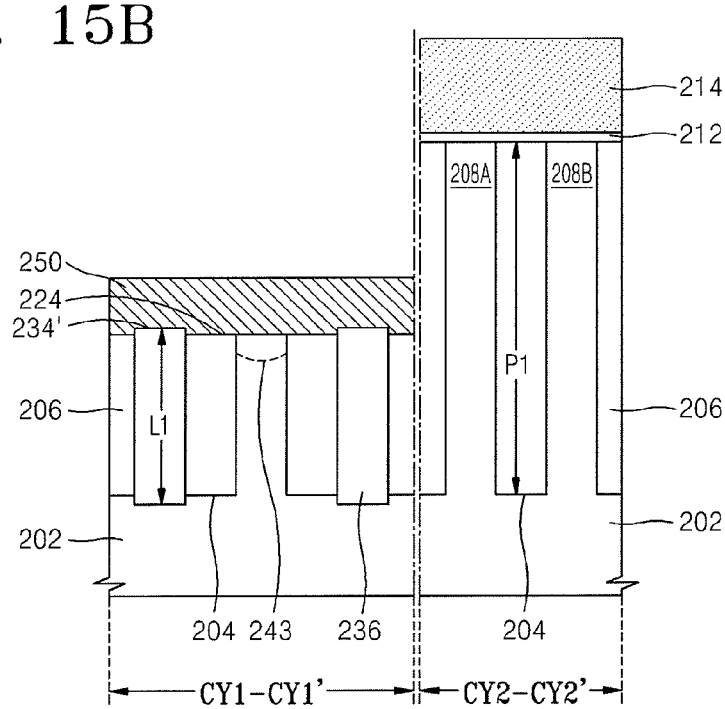

FIGS. 15A to 15B are cross-sectional views illustrating a method of fabricating the semiconductor device 200 of FIG. 14, according to an exemplary embodiment of the inventive concept. FIG. 15A illustrates cross-sectional views taken along the lines BX1-BX1' and BX2-BX2' in FIG. 7A. FIG. 15B illustrate cross-sectional views taken along the lines CY1-CY1' and CY2-CY2' in FIG. 7A.

FIGS. 15A and 15B illustrate processes that follow substantially same ion implantation processes to those described above with reference FIGS. 3A to 9B. In an ion implantation process according to the current embodiment, lightly-doped dopant regions (not shown) and heavily-doped dopant regions 243 may be formed around the lower surfaces of bit line trenches 224 in the second active region 208I to define first source/drain regions 240. That is, both the lightly-doped dopant regions and the heavily-doped dopant regions 243 may be formed. In an embodiment, the first source/drain regions 240 may be formed by implanting, for example, N-type impurity ions. To form the lightly-doped dopant regions may be optional. The lightly-doped dopant regions may not be formed depending to the characteristics of a desired device.

Next, it is noted that unlike the processes described with reference to FIGS. 10A and 10B, processes for partially removing the portions of the second active region 208I below the bit line trenches 224 and the device isolation trenches 234', the first device isolation layer 206, and the second device isolation layer 236 are not performed in the current exemplary embodiment depicted in FIGS. 15A and 15B. In addition, unlike the methods described in connection with FIGS. 10A and 10B, in the current embodiment depicted in FIGS. 15A and 15B, the first mask pattern 214 on the active pillars 208A and 208B and the first device isolation layer 206 are not partially removed to have a lower height. Thus, in the current exemplary embodiment depicted in FIGS. 15A and 15B, the buried bit lines may be formed immediately after forming the first/source drain regions 240.

A process for forming the buried bit lines 250 may be the same as the process described above with reference to FIGS. 11A and 11B. A conductive material is deposited on the resultant structure in which the first source/drain regions 240 are formed, to form a conductive layer (not shown) that fills the bit line trenches 224 and device isolation trenches 234'. Next, the conductive layer is partially removed by etching back to remain only in lower portions of the bit line trenches 224 and the device isolation trenches 234', thereby forming the plurality of buried bit lines 250 therein.

Subsequent processes may be performed in substantially the same manner as described above with reference to FIGS. 12A to 13B.

The method of fabricating the semiconductor device 200 according to the current embodiment of the inventive concept is simpler, since the processes for etching back the bit line trenches 224 and the device isolation trenches 234' are not performed.

Figure 16:
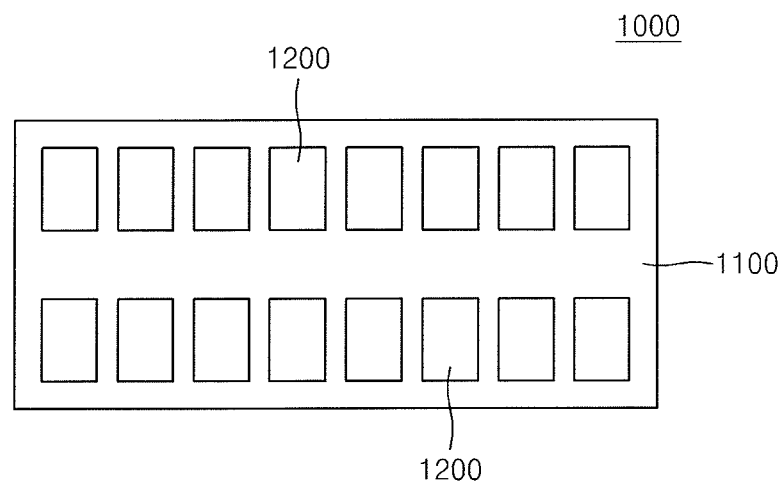
FIG. 16 is a plan view of a memory module including a semiconductor device according to an exemplary embodiment of the inventive concept.

FIG. 16 is a plan view of a memory module 1000 including a semiconductor device according to an embodiment of the inventive concept.

The memory module 1000 may include, for example, a printed circuit board 1100 and a plurality of semiconductor packages 1200.

The plurality of semiconductor packages 1200 may each include a semiconductor device according to an embodiment of the inventive concept. The plurality of semiconductor packages 1200 may include structural characteristics of at least one semiconductor device selected from among those of FIG. 1 to 15B according to an exemplary embodiment of the inventive concept.

According to an embodiment of the inventive concept, the memory module 1000 may be, for example, a single in-line memory module (SIMM) with semiconductor packages 1200 mounted on one side of a printed circuit board, or a dual inline memory module (DIMM) with semiconductor packages 1200 mounted on opposite sides of the printed circuit board. Alternatively, according to an embodiment of the inventive concept, the memory module 1000 may be, for example, a fully buffered dual in-line memory module (FBDIMM) having an advanced memory buffer (AMB) that provides external signals to the plurality of semiconductor packages 1200.

Figure 17:
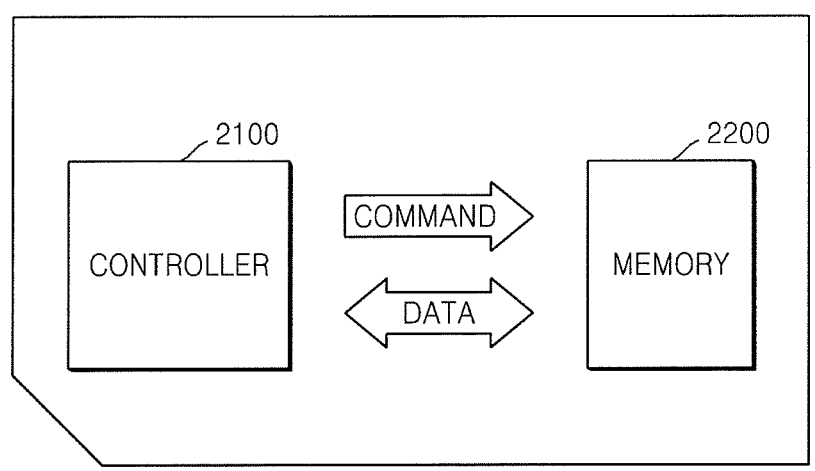
FIG. 17 is a schematic diagram of a memory card including a semiconductor device according to an exemplary embodiment of the inventive concept.

FIG. 17 is a schematic diagram of a memory card 2000 including a semiconductor device according to an exemplary embodiment of the inventive concept.

The memory card 2000 may include, for example, a controller 2100 and a memory 2200 that may exchange electric signals with each other. For example, when the controller 2100 transmits a command, the memory 2200 may transmit data the memory unit 2200.

The memory 2200 may include a semiconductor device according to an exemplary embodiment of the inventive concept. The memory 2200 may include structural characteristics of at least one semiconductor device selected from among those of FIG. 1 to 15B according to the embodiments of the inventive concept.

The memory card 2000 may include any of various memory cards such as, for example, a memory stick card, a smart media (SM) card, a secure digital (SD) card, a mini SD card, or a multimedia card (MMC).

Figure 18:
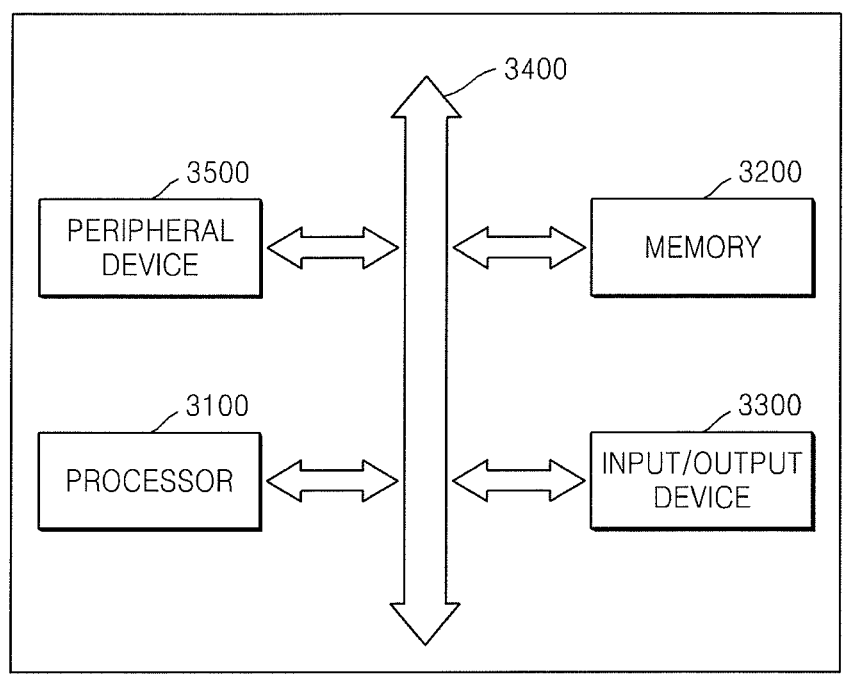
FIG. 18 is a schematic diagram of a system including a semiconductor device according to an exemplary embodiment of the inventive concept.

FIG. 18 is a schematic diagram of a system 3000 including a semiconductor device according to an embodiment of the inventive concept.

For example, in the system 3000, a processor 3100, a memory 3200, an input/output device 3300 may communicate data with each other via a bus 3400.

The memory 3200 of the system 3000 may include, for example, a random access memory (RAM), and a read only memory (ROM). The system 3000 may include a peripheral device 3500, for example, a floppy disk drive or a compact disk (CD)-ROM drive.

The memory 3200 may include a semiconductor device according to exemplary embodiments of the inventive concept. The memory 3200 may have structural characteristics of at least one semiconductor device selected from among those of FIG. 1 to 15B according to the an embodiment of the inventive concept.

The memory unit 3200 may store codes and data for operating the processor 3100.

The system 3000 may be used, for example, in mobile phones, MP3 players, navigation devices, portable multimedia players (PMPs), solid state disks (SSDs), or other household appliances.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, the method comprising:
    forming a plurality of first device isolation layers in a substrate as a pattern of lines, the plurality of first device isolation layers extending in a first direction and having a first depth from an upper surface of a substrate, to define a plurality of active regions that extend in the first direction as a pattern of lines;
    forming a plurality of trenches that extend in a second direction perpendicular to the first direction and that have a second depth smaller than the first depth, and a first width; etching portions of the substrate that are under some of the plurality of trenches that are selected at a predetermined interval, to form a plurality of device isolation trenches having a third depth that is greater than the second depth;
    forming second device isolation layers that include an insulating material, in lower portions of the plurality of device isolation trenches; and
    forming buried bit lines in lower portions of the plurality of trenches and the plurality of device isolation trenches.

2. The method of claim 1, wherein, in the forming of the second device isolation layers, portions of the substrate that are exposed by a bottom and a sidewall of the plurality of device isolation trenches are oxidized to form the second device isolation layers.

3. The method of claim 1, further comprising, after the forming of the plurality of trenches, forming an insulating liner in the plurality of trenches.

4. The method of claim 3, wherein the forming of the plurality of device isolation trenches comprises:
    forming a mask pattern including openings that expose some of the plurality of trenches where the device isolation trenches are to be formed;
    removing the insulating liner from bottoms of the trenches that are exposed by the openings; and
    etching portions of the substrate that are exposed by the removing of the insulating liners from bottoms of the trenches.

5. The method of claim 3, wherein, in the forming of the second device isolation layers, portions of the substrate that are in the lower portions of the plurality of device isolation trenches are selectively oxidized using the insulating liner on sidewalls of the device isolation trenches as anti-oxidation layers, according to a local oxidation of silicon (LOCOS) process.

6. The method of claim 1, wherein, in the forming of the plurality of device isolation trenches, the plurality of device isolation trenches are formed in alternating ones of intersections at which the plurality of trenches cross the first active regions.

7. The method of claim 1, wherein the second device isolation layers have a second width that is greater than the first width.

8. The method of claim 1, further comprising, after the forming of the second device isolation layers, partially etching portions of the substrate and the first device isolation layers that are below the plurality of trenches, and portions of the second device isolation layers that are below the plurality of device isolation trenches.

9. The method of claim 8, wherein, after the partial etching, the plurality of trenches and the plurality of device isolation trenches have a depth that is less than the first depth.

10. The method of claim 8, further comprising, after the partial etching, implanting dopant ions at a low concentration to define first source/drain regions in the substrate.

11. The method of claim 1, further comprising, after the forming of the second device isolation layers, performing an ion implantation process of forming the first source/drain regions in the substrate.

12. The method of claim 1, wherein lower surfaces of the buried bit lines are located at a depth that is less than the second depth.

13. The method of claim 1, wherein the active regions each comprise two active pillars between each two adjacent device isolation trenches, the two active pillars being separated by one of the plurality of trenches.

14. The method of claim 13, further comprising:
    forming an insulating layer on the buried bit lines to fill the plurality of trenches and the plurality of device isolation trenches;
    forming second source/drain regions in upper portions of the plurality of active regions;
    forming a gate insulating layer on one vertical surface of each of the active pillars; and
    forming a contact gate that has a lower surface lower than the upper surface of the substrate and that faces the one vertical surface with the gate insulating layer therebetween, and forming word lines that extend on the upper surface of the substrate and are connected to the contact gates.

15. A method of fabricating a semiconductor device, the method comprising:
    defining a plurality of first active regions in a substrate as a pattern of lines;
    forming a plurality of trenches that extend perpendicular to the plurality of first active regions in the substrate;
    etching a bottom portion of some of the plurality of trenches and a portion of the substrate located underneath the some of the plurality of trenches to extend the some of the plurality of trenches to a depth to form a plurality of device isolation trenches; and forming an insulating layer in the plurality of device isolation trenches to form a plurality of second active regions having an island shape.

16. A method of fabricating a semiconductor device, the method comprising:

forming a plurality of first device isolation layers in a substrate as a pattern of lines, the plurality of first device isolation layers extending parallel to each other in a first direction and having a first depth from an upper surface of a substrate, to define a plurality of first active regions as a pattern of lines extending parallel to each other;

sequentially forming a pad oxide layer pattern and a first mask pattern on the first device isolation layers and the first active regions as a pattern of lines extending parallel to each other in a second direction; etching portions of the first device isolation layers and the first active regions that are exposed by the pad oxide layer pattern and the first mask pattern to form a plurality of bit line trenches in the first device isolation layers and the first active regions at a second depth smaller than the first depth of the first device isolation layer, wherein the bit lines divide the first active regions into a plurality of active pillars; forming an insulating liner on an upper surface of the first mask pattern and on inner walls of each of the bit line trenches;

forming a second mask pattern including a plurality of openings alternatively arranged and which expose bottoms of some of the plurality of bit line trenches;

etching portions of the insulating liner on the upper surface of first mask pattern and on the bottoms of the bit line trenches exposed by the openings of the second mask pattern to extend the exposed bit line trenches thereby forming a plurality of device isolation trenches having a third depth greater than the second depth such that the first active regions as a pattern of lines are divided by the device isolation trenches into second active regions having an island shape;

removing the second mask pattern;

oxidizing portions of the second active regions of the substrate to form a plurality of second device isolation layers in a lower portion of each of the device isolation trenches and reducing the third depth of the device isolation trenches;

removing the insulating liners on a bottom of the bit line trenches not exposed by the second mask pattern;

performing an ion implantation process using the first mask pattern as an ion implantation mask to define heavily-doped dopant regions in portions of the second active regions that are exposed by a bottom and a sidewall of the device isolation trenches as first source/drain regions;

forming a plurality of bit lines in lower portions of the bit line trenches and the device isolation trenches, wherein each of the bit lines extends between an adjacent two of the plurality of active pillars in one of the plurality of second active regions;

removing the second mask pattern and the pad oxide layer pattern and forming an insulating layer in the bit line trenches and the device isolation trenches above the bit lines, wherein the insulating layer covers a corresponding one of the bit lines between the adjacent two of each of the plurality of active pillars of a corresponding one of the second active regions and wherein the insulating layer extends above and parallel to the bit lines across the plurality of active regions through inner spaces in the bit line trenches and the device isolation trenches; and performing an ion implantation process on an upper surface of the active pillars to form second source/drain regions.

17. The method of claim 16, wherein prior to the forming of the heavily-doped dopant regions, the method further comprising removing portions of the second active regions below the bit line trenches and the device isolation trenches, removing portions of the first device isolation layers and the second device isolation layer and removing portions of the first mask pattern on the active pillars and the first device isolation layers to extend the bit lines and the device isolation trenches.

18. The method of claim 16, wherein the bit line trenches are formed arranged at an equal interval in the first direction in which the first active regions extend in the substrate, wherein a width of each of the bit line trenches in the first direction in which the first active region extend is no less than a width of each of the active pillars.

19. The method of claim 16, wherein when the device isolation layers are formed, an upper surface of the second device isolation layers in the device isolation trenches is formed substantially coplanar with the bottom of the bit line trenches.

20. The method of claim 16, wherein prior to the forming of the heavily doped dopant regions, the method for forming the first source/drain regions further comprising forming lightly doped dopant regions near the bottoms of the bit line trenches in the second active region such that the heavily doped dopant region and the lightly doped dopant region define the first source/drain regions around a lower portion of the bit line trenches in the second active regions of the substrate.

* * * * *